US006819360B1

(12) United States Patent
Ide et al.

(10) Patent No.: US 6,819,360 B1
(45) Date of Patent: Nov. 16, 2004

(54) IMAGE PICKUP ELEMENT AND APPARATUS FOR FOCUSING

(75) Inventors: Masataka Ide, Hachioji (JP); Junichi Ito, Tokyo (JP); Hisashi Goto, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 09/540,840

(22) Filed: Mar. 31, 2000

(30) Foreign Application Priority Data

Apr. 1, 1999 (JP) .......................................... H11-095252
Apr. 6, 1999 (JP) .......................................... H11-099071

(51) Int. Cl.$^7$ .............................................. H04N 5/225
(52) U.S. Cl. ....................................... 348/340; 348/345
(58) Field of Search ................................ 348/345, 348, 348/349, 350, 351, 315, 317, 320, 322, 340; 396/121; 250/204

(56) References Cited

U.S. PATENT DOCUMENTS

| | | | | |
|---|---|---|---|---|
| 4,185,191 A | * | 1/1980 | Stauffer | 250/204 |
| 5,485,209 A | * | 1/1996 | Muramoto et al. | 348/349 |
| 6,674,470 B1 | * | 1/2004 | Tanaka et al. | 348/302 |

FOREIGN PATENT DOCUMENTS

| | | |
|---|---|---|
| JP | 08201683 | 8/1996 |
| JP | 10197783 | 7/1998 |
| JP | 10213737 | 8/1998 |
| JP | 10274562 | 10/1998 |

* cited by examiner

*Primary Examiner*—Tuan Ho
*Assistant Examiner*—Heather R. Long
(74) *Attorney, Agent, or Firm*—Straub & Pokotylo; John C. Pokotylo

(57) ABSTRACT

The present invention provides an image pickup apparatus which photoelectrically converts an optical image transmitted through a photographing optical system and formed on a photoconductive surface. The image pickup apparatus includes a first microlens array and a second microlens array each of which has a focal position in the vicinity of the photoconductive surface and is arrayed in a two-dimensional manner, a first photoconductive element group including units each formed by a single photoconductive element which is disposed in the vicinity of the focal position of the first microlens array and outputs a first video signal, and a second photoconductive element group including units each formed by a pair of photoconductive elements which are disposed in the vicinity of the focal position of the second microlens array and output a pair of second video signals.

9 Claims, 29 Drawing Sheets

- 120: PHOTOGRAPHING IMAGE PLANE
- 200B: FOCUS DETECTING AREA
- 200C: FOCUS DETECTING AREA
- 200A: FOCUS DETECTING AREA

FIG.32

| R | G | R | G | R | G | R | G | ---- |
|---|---|---|---|---|---|---|---|------|
| G | B | G | B | G | B | G | B | ---- |
| R | G | R | G | R | G | R | G | ---- |
| G | B | G | B | G | B | G | B | ---- |

IMAGE PICKUP ELEMENT AND APPARATUS FOR FOCUSING

BACKGROUND OF THE INVENTION

1. Field of the Invention

This invention relates to an image pickup element and an image pickup apparatus having an image pickup element, and more specifically, to an image pickup element which converts an optically formed image into an electrical image signal, or an image pickup apparatus provided with such an image pickup element as well as an automatic focus adjusting device and capable of obtaining an electronic image signal.

2. Related Background Art

In recent years, use of various kinds of image pickup apparatus such as digital still cameras or digital video cameras (hereinafter referred to as electronic image pickup apparatus) has become wide spread, and various techniques as to such an electronic image pickup apparatus have been disclosed and used in general practice. The electronic image pickup apparatus is constructed to photoelectrically convert an optical subject image formed by a photographing optical system such as a photographing lens into an electrical signal by using an image pickup element made of a CCD (Charge Coupled Device) and record the thus-obtained electrical image signal or video signal on a predetermined recording medium or the like as image data or video data such as digital data.

For example, there is a related art electronic image pickup apparatus having an automatic focus adjusting device (AF means) which makes detection of an in-focus position relative to a desired subject image by using an image pickup element. Such AF means moves a predetermined photographing lens or the like to the detected in-focus position by using a predetermined driving mechanism or the like, thereby automatically performing a focus adjusting operation. This type of AF means has been proposed in, for example, Japanese Patent Laid-Open No. 213737/1998, and various types of AF means have been put into practice.

The electronic image pickup apparatus disclosed in Japanese Patent Laid-Open No. 213737/1998 utilizes a so-called hill-climbing type of AF means. This hill-climbing type of AF means detects the maximum value of the contrast of an optical image (subject image) transmitted through a photographing optical system such as a photographing lens and formed on the photoconductive surface of an image pickup element, thereby finding a predetermined position of the photographing lens at this time.

Another AF means for the related art electronic image pickup apparatus is a TTL phase-difference detecting type of AF means. Various proposals have been made with respect to this type of AF means in, for example, Japanese Patent Laid-Open No. 197783/1998, Japanese Patent Publication No. 49841/1982 and Japanese Patent Laid-Open No. 274562/1998.

The AF means of the electronic image pickup apparatus disclosed in Japanese Patent Laid-Open No. 197783/1998 drives a diaphragm member to perform pupil-division processing in a time-sharing manner and causes a single image pickup element to receive a light beam passing through each aperture (pupil) of the diaphragm member, thereby detecting a phase difference.

The AF means of the electronic image pickup apparatus disclosed in Japanese Patent Publication No. 49841/1982 is a so-called fly's eye lens system. This AF means causes a pair of photoconductive elements, each made of line sensors, to receive light beams transmitted through lens arrays, computes an image deviation quantity, i.e., a phase difference, by processing signals outputted from the line sensors, and finds, on the basis of the computational result, the amount of forward movement of a focusing lens which constitutes part of a photographing lens and is responsible for focus adjustment, thereby realizing an automatic focus adjusting operation.

The AF means of the electronic image pickup apparatus disclosed in Japanese Patent Laid-Open No. 274562/1998 is a TTL phase-difference detecting type of AF means which is called a refocusing system. This AF means converges, through a condenser lens, a light beam transmitted through a photographing lens, divides the converged light beams into two light beams by a separator lens to refocus two subject images on the photoconductive surface of a photoconductive element (a photoelectric conversion element), and detects the quantity of deviation between the two images, detecting a focus position.

In addition, Japanese Patent Laid-Open No. 201683/1996 discloses an art which relates to a refocusing type TTL phase-difference detecting device having plural focus detecting areas.

In the hill-climbing type of AF means disclosed in the above-cited Japanese Patent Laid-Open No. 213737/1998 and the like, a position at which the contrast of a subject image formed on the photoconductive surface of the image pickup element reaches a maximum is detected while the photographing lens is being moved, and then the photographing lens is made to move to a predetermined position. However, this leads to the problem that, in general, a long focus detecting time is needed and an operating speed at which to execute an automatic focus adjusting operation becomes slow.

The AF means disclosed in the above-cited Japanese Patent Laid-Open No. 197783/1998 is constructed to drive the mechanical diaphragm member to perform the pupil-division processing, and needs a driving mechanism for the diaphragm member and also needs spatial room for installation of constituent members, or the like, of the driving mechanism. It can be said, therefore, that this AF means is unfavorable for the recent strong demand for a further reduction in the size of the electronic image pickup apparatus.

In addition, in the AF means disclosed in Japanese Patent Laid-Open No. 197783/1998, since the pupil-division processing is processed in a time-division manner, a time difference occurs between obtained images. This leads to the problem that the accuracy of detection of a subject which moves at a high speed is degraded to a great extent. Moreover, in the AF means disclosed in Japanese Patent Laid-Open No. 197783/1998, since a predetermined time is needed to drive the mechanical diaphragm member, there is the problem that the speed of focus detection is lowered. In addition, it is a difficult problem to precisely retain the mechanical accuracy.

According to the AF means disclosed in the above-cited Japanese Patent Publication No. 49841/1982, Japanese Patent Laid-Open No. 274562/1998 and the like, the apparatus needs to be constructed to divide a subject light beam transmitted through the photographing lens into light beams and conduct one of the light beams to a lens array, a condenser lens and the like disposed at predetermined positions. Therefore, the AF means has the problem of being subject to optical restrictions or spatial restrictions.

In the AF means disclosed in the above-cited Japanese Patent Laid-Open No. 274562/1998, since it is necessary to newly dispose the refocusing optical system, spatial restrictions become large in the interior of the electronic image pickup apparatus, resulting in the problem of hindering the reduction of the size of the electronic image pickup apparatus.

In the AF means disclosed in the above-cited Japanese Patent Laid-Open No. 201683/1996, since a refocusing optical system and an AF sensor are needed for each of the plural focus detecting areas, there is the problem of further increases in manufacturing cost and occupied space.

SUMMARY OF THE INVENTION

A first object of the present invention is to provide an image pickup element which enables focus detecting speed to be improved without the need to newly add constituent members such as focus-detecting mechanical members or optical members which constitute a focus-detecting optical system, and without the need to increase the size of an electronic image pickup apparatus to which to apply the image pickup element, whereby further reductions in cost and space as well as a highly accurate focus adjusting function can be realized.

A second object of the present invention is to provide an image pickup apparatus having a focus adjusting function which can be reduced in cost and space because there is no need to add a new mechanism nor optical system, and which has a far wider focus detecting area and an improved AF speed and, in addition, can realize an accurate focus adjusting function.

To be brief, the invention provides an image pickup apparatus which photoelectrically converts an optical image transmitted through a photographing optical system and formed on a photoconductive surface. The image pickup apparatus includes: a first microlens array, and a second microlens array each of which has a focal position in the vicinity of the photoconductive surface and is arrayed in a two-dimensional manner; a first photoconductive element group including units each formed by a single photoconductive element which is disposed in the vicinity of the focal position of the first microlens array and outputs a first video signal; and a second photoconductive element group including units each formed by a pair of photoconductive elements which are disposed in the vicinity of the focal position of the second microlens array and output a pair of second video signals.

The invention also provides an image pickup element for use in an image pickup apparatus. The image pickup element includes: a first photoconductive element group which receives a subject light image; a first small lens group which converges a subject light beam on the first photoconductive element group; a second small lens group which divides, by pupils, a light beam transmitted through a photographing lens; and a second photoconductive element group including pairs of photoconductive elements which respectively receive light beams divided by pupils of a corresponding small lens of the second small lens group, the second small lens group and the second photoconductive element group including the pairs of photoconductive elements being formed on one chip of the image pickup element.

The invention also provides an image pickup apparatus having an image pickup element which receives and photoelectrically converts a subject light beam transmitted through a photographing optical system. The image pickup apparatus includes: an image pickup area part which has, in an arrayed manner, a first photoconductive element group which receives a subject light beam transmitted through the photographing optical system and a first small lens group which converges the subject light beam on the first photoconductive element group, the image pickup area part generating an output of the first photoconductive element group for picking up an image; and a focus detecting area part including focus detecting block columns in each of which a second small lens group and a second photoconductive element group are formed in a regularly arrayed manner and which are respectively disposed in plural areas of the image pickup element, the second small lens group dividing by pupils the subject light beam transmitted through the photographing optical system, the second photoconductive element group including pairs of photoconductive elements which respectively receive light beams divided by pupils of a corresponding small lens of the second small lens group, the focus detecting area part generating outputs of the pairs of photoconductive elements of the second photoconductive element group for the purpose of detecting focus.

The invention also provides an image pickup apparatus having an image pickup element which performs photoelectric conversion of an optical image transmitted through a photographing lens and formed on a photoconductive surface. The image pickup apparatus includes: a first small lens array and a second small lens array each of which has a focal position on the photoconductive surface and is arrayed in a two-dimensional manner; a first photoconductive element group including units each formed by a single photoconductive element which is disposed in the vicinity of the focal position of the first small lens array and outputs a first video signal; a second photoconductive element group including units each formed by a pair of photoconductive elements which are disposed in the vicinity of the focal position of the second small lens array and output a pair of second video signals; and plural focus detecting block columns in each of which the second small lens array group and the second photoconductive element group are regularly arrayed.

The invention also provides an image pickup apparatus having an image pickup element which photoelectrically converts an optical image transmitted through a photographing optical system and formed on a photoconductive surface. The image pickup apparatus includes: a first microlens array and a second microlens array each of which has a focal position in the vicinity of the photoconductive surface and is arrayed in a two-dimensional manner; a first photoconductive element group including units each formed by a single photoconductive element which is disposed in the vicinity of the focal position of the first microlens array and outputs a first video signal; and a second photoconductive element group including units each formed by a pair of photoconductive elements which are disposed in the vicinity of the focal position of the second microlens array and output a pair of second video signals.

The invention also provides an image pickup apparatus having an image pickup element which photoelectrically converts an optical image transmitted through a photographing optical system and formed on a photoconductive surface. The image pickup apparatus includes: an image pickup area part which has, in an arrayed manner, a first photoconductive element group which receives a subject light beam transmitted through the photographing optical system and a first small lens group which converges the subject light beam on the first photoconductive element group, the image pickup area part generating an output of the first photoconductive element group for picking up an image; a focus detecting area part including focus detecting block columns in each of which a second small lens group and a second photoconductive element group are formed in a regularly arrayed manner and which are respectively disposed in plural areas of the image pickup element, the second small lens group dividing, by pupils the subject light beam transmitted through the photographing optical system, the second photoconductive element group including pairs of photoconductive elements which respectively receive light beams divided by pupils of a corresponding small lens of the second small lens group, the focus detecting area part generating outputs of the pairs of photoconductive elements of the second photoconductive element group for the purpose of detecting focus; and a control means which picks up an image on the basis of the output of the first photoconductive element group of the image pickup area part, and performs focus detection on the basis of the output generated by the second photoconductive elements of the plural focus detecting block columns.

These and other objects and advantages of the invention will further become apparent from the following detailed description.

According to the present invention, it is possible to provide an image pickup element which enables focus detecting speed to be improved without the need to newly add constituent members such as mechanical members or optical members and without the need to increase the size of the electronic image pickup apparatus, whereby further reductions in cost and space, as well as a highly accurate focus adjusting function, can be realized.

According to the present invention, it is also possible to provide an image pickup apparatus having a focus adjusting function which can be reduced in cost and space because there is no need to add a new mechanism nor optical system, and which has a far wider focus detecting area and an improved AF speed and, in addition, can realize an accurate focus adjusting function.

BRIEF DESCRIPTION OF THE DRAWINGS

FIG. 32 is a view showing the Bayer matrix of color filters for the image pickup element according to the fourth embodiment;

DETAILED DESCRIPTION OF THE PREFERRED EMBODIMENTS

Figure 1:
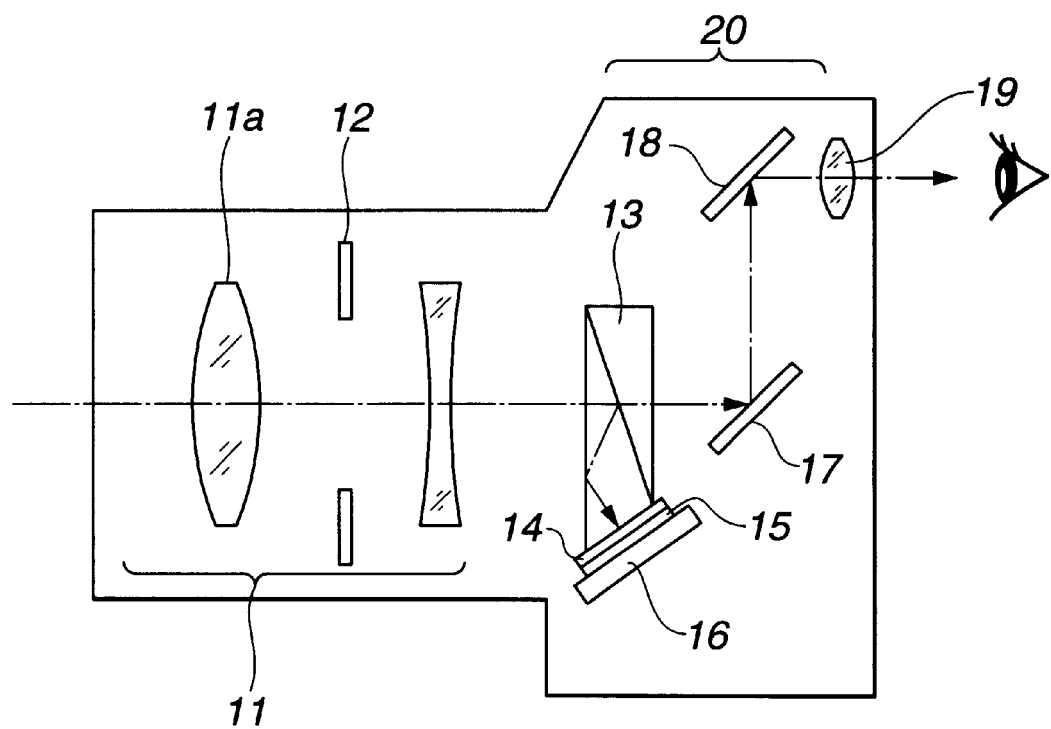
FIG. 1 is a block diagram showing constituent members of a main optical system in an electronic image pickup apparatus having an image pickup element according to a first embodiment of the present invention.

As shown in the block diagram of FIG. 1, the optical system of the present electronic image pickup apparatus includes a photographing optical system 11 which converges a subject light beam, an image pickup system which picks up an image by performing photoelectric conversion on a subject image based on the subject light beams, a viewfinder optical system 20 which enables visual observation of the subject image, and a dividing optical system which divides the subject light beam converged by the photographing optical system 13 into two subject light beams and conducts the two subject light beams to the image pickup system and the viewfinder optical system 20, respectively.

Incidentally, in FIG. 1, the optical paths of light beams from a subject (hereinafter referred to as subject light beams) in the present electronic image pickup apparatus are shown in integrated form.

The photographing optical system 11 includes plural lenses which contain a focusing lens 11a which makes adjustment of focus by moving in the direction of the optical axis, and a diaphragm part 12 which is capable of holding a predetermined diaphragm aperture and has a shutter function as well as the function of completely blocking the subject light beam.

The dividing optical system includes a beam splitter 13 which is made of plural prisms or the like capable of dividing the subject light beam and is disposed behind the photographing optical system 11 at a predetermined location on the optical axis thereof.

Various kinds of members which constitute the image pickup system which converts a subject image formed by subject light transmitted through the photographing optical system 11 into an electrical signal and forms an image signal are disposed in the vicinity of the beam splitter 13. This image pickup system includes an infrared cut-filter 14 which eliminates infrared components by transmitting through itself one of two subject light beams into which the subject light beam is divided by the beam splitter 13, an optical low-pass filter (hereinafter referred to simply as an LPF) 15 which reduces noise components such as moiré, and an image pickup element (hereinafter referred to simply as a CCD) 16 such as a CCD which performs photoelectric conversion on an optical subject image.

The viewfinder optical system 20 includes a first mirror 17 which is made of a total reflection mirror disposed at a predetermined location behind the beam splitter 13 along the optical axis of the photographing optical system 11 and inclined at an angle of approximately 45 degrees with respect to the optical axis, a second mirror 18 which is disposed on the optical axis of the subject light beam reflected by the first mirror 17 and is inclined at an angle of approximately 45 degrees with respect to the same optical axis, and a viewfinder eyepiece lens 19 which transmits therethrough the subject light beam reflected by the second mirror 18 and forms a subject image for observation.

In the present electronic image pickup apparatus constructed in this manner, first of all, a subject light beam enters the photographing optical system 11 and is restricted to a predetermined light quantity by the diaphragm part 12. Incidentally, in a predetermined case as well, for example, during the transfer of the stored charge of the CCD 16, the diaphragm part 12 blocks the subject light beam as required.

The subject light beam transmitted through the photographing optical system 11 is divided into two subject light beams by the beam splitter 13, and one of the two subject light beams is conducted toward the image pickup system, and is conducted to the CCD 16 via the infrared cut-filter 14 and the LPF 15. Then, a subject image is formed on the photoconductive surface of the CCD 16.

In the meantime, the other of the two subject light beams into which the subject light beam has been divided by the beam splitter 13 is transmitted through the beam splitter 13 and is rectilinearly conducted toward the viewfinder optical system 20.

The subject light beam conducted toward the viewfinder optical system 20 is reflected by an angle of approximately 90 degrees by the first mirror 17 and travels toward the top of the present electronic image pickup apparatus, and is further reflected by an angle of approximately 90 degrees by the second mirror 18 and travels toward the eyepiece lens 19 disposed behind the second mirror 18. Then, the subject light beam is transmitted through the eyepiece lens 19 to form a subject image for observation. Thus, a user of the present electronic image pickup apparatus can observe the subject image with an eye of his/her own. Incidentally, the subject image formed by the viewfinder optical system 20 is approximately equivalent to the subject image formed on the photoconductive surface of the CCD 16.

The construction of the electrical system of the present electronic image pickup apparatus will be described below.

Figure 2:
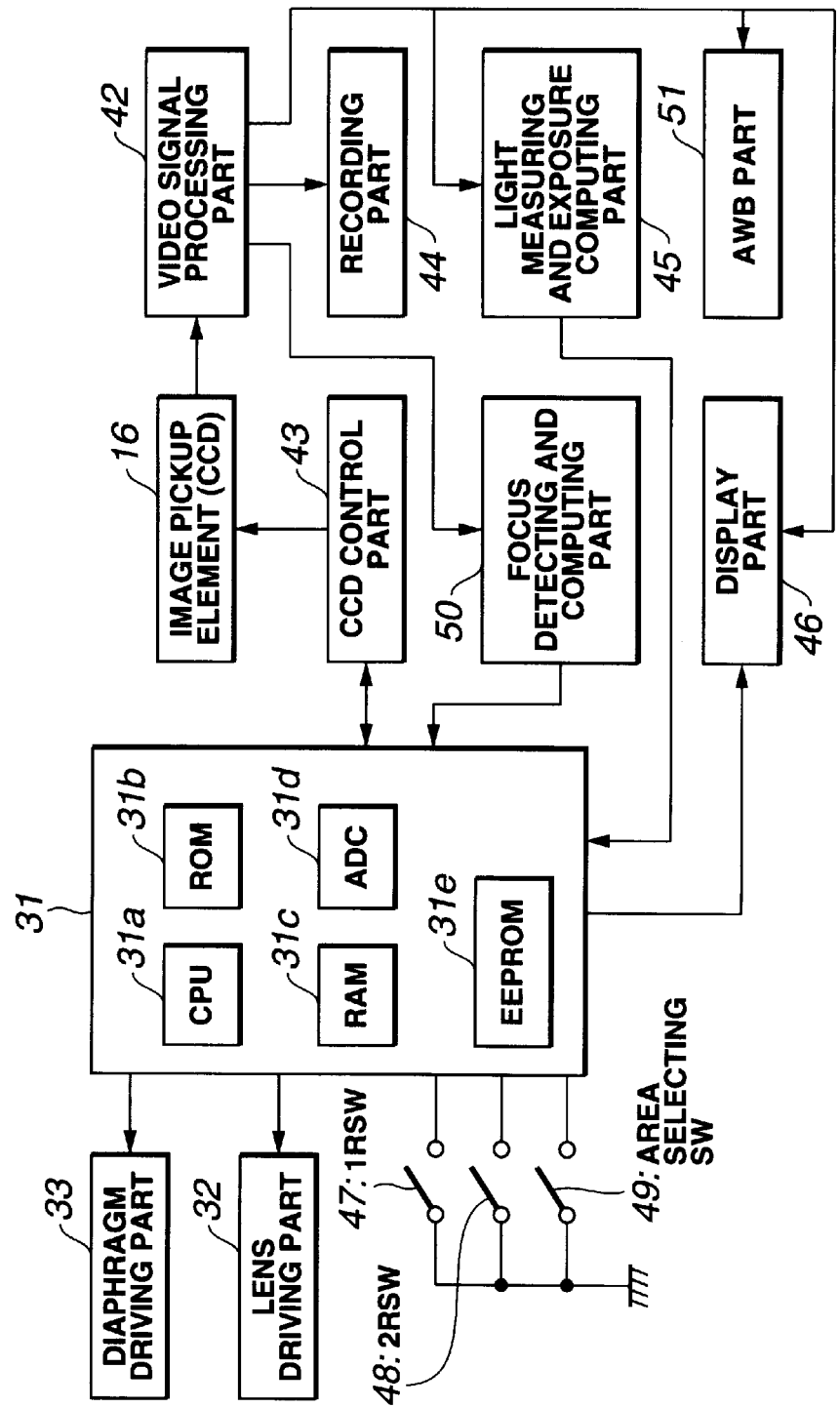
FIG. 2 is a block diagram showing the essential electrical constituent members of the electronic image pickup apparatus shown in FIG. 1.

As shown in the block diagram of FIG. 2, in the present electronic image pickup apparatus, a microcomputer 31 which is control means made of a central processing unit (hereinafter referred to as a CPU) 31a or the like exerts control over all parts. Specifically, the microcomputer 31 serves as a control device for the present electronic image pickup apparatus system, and is a controller which includes in its inside the CPU 31a, a ROM 31b, a RAM 31c, an A/D converter (ADC) 31d and an EEPROM 31e. A series of operations in the present electronic image pickup apparatus is controlled in accordance with the sequence program stored in advance in the ROM 31b included in the microcomputer 31. Stored in the EEPROM 31e are unique correction data associated with focus adjustment computation, light measuring and exposure computation, AWB (automatic white balance) computation and the like.

A diaphragm driving part 33, a lens driving part 32 and a switch group are electrically connected to the microcomputer 31. The diaphragm driving part 33 drives and controls the diaphragm part 12 (refer to FIG. 1), and the lens driving part 32 drives and controls the focusing lens 11a and the like (refer to FIG. 1). The switch group generates various kinds of command signals in interlocking relationship to various kinds of manipulating members (not shown), and includes, for example, a first release switch (1 RSW) 47, a second release switch (2RSW) 48 and an area selecting switch 49. The 1RSW 47 generates a command signal indicative of an instruction to execute preliminary operations such as light measurement and an AF operation when a photographing operation is to be started. The 2RSW 48 generates a command signal indicative of an instruction to drive the diaphragm part 12 and the like to execute an exposure operation. The area selecting switch 49 generates a command signal indicative of an instruction to selectively specify plural kinds of preset AF areas (predetermined areas in which to perform focus detection) when an AF operation is to be performed.

Incidentally, the 1RSW 47 and the 2RSW 48 are constructed to be manipulated with a single manipulating member, and are in the form of a so-called two-stroke switch.

In addition, a CCD control part 43 is electrically connected to the microcomputer 31. The CCD control part 43 drives and controls the CCD 16, and includes a timing generator (hereinafter referred to as a TG) 82 and a signal generator (hereinafter referred to as an SG) 83 (refer to FIG. 3). The CCD 16 is electrically connected to the CCD control part 43 so that the CCD control part 43 controls the driving of the CCD 16.

The CCD 16 converts into an electrical signal man optical subject image formed by a subject light beam transmitted through the photographing optical system 11. A vertical overflow drain type CCD is applied to the CCD 16 in the present electronic image pickup apparatus, and the detailed construction of the CCD 16 will be described later (refer to FIGS. 4 to 12A–12G).

A video signal processing part 42 is electrically connected to the CCD 16. The video signal processing part 42 receives the output signal from the CCD 16 and performs predetermined processing on the received signal, thereby generating a predetermined form of image signal. A focus detecting and computing part 50, a light measuring and exposure computing part 45, an AWB part 51, a display part 46 and a recording part 44 are electrically connected to the video signal processing part 42, and the video signal processing part 42 generates and outputs image signals having different forms optimum for the respective parts 44, 45, 46, 50 and 51, as well as information accompanying the image signals.

The focus detecting and computing part 50 is a circuit which receives an output signal from the video signal processing part 42 and detects and computes a focus position. The computational result of the focus detecting and computing part 50 and decision data as to the state of focus as well as predetermined driving quantity data for the focusing lens 11a are outputted to the microcomputer 31.

The light measuring and exposure computing part 45 is a circuit which receives an output signal from the video signal processing part 42, detects the luminance or the like of a subject and calculates optimum exposure data such as an aperture value for the diaphragm part 12 and an electronic shutter speed for the CCD 16. The computational result of the light measuring and exposure computing part 45 is outputted to the microcomputer 31. When receiving the computational result, the microcomputer 31 drives the diaphragm part 12 via the diaphragm driving part 33 so that the diaphragm part 12 is set to a predetermined aperture value, and also drives and controls the CCD 16 via the CCD control part 43 at a predetermined electronic shutter speed value.

The AWB part 51 is a circuit which receives an output signal from the video signal processing part 42 and automatically adjusts the white balance of a subject to an optimum level. An image signal optimally adjusted by the AWB part 51 is outputted to the display part 46.

The display part 46 is formed by an image display device such as a liquid crystal display (LCD), and is capable of displaying as a visual image the image signal inputted via the video signal processing part 42 and the AWB part 51. The display part 46 also visually displays internal information as to the present electronic image pickup apparatus, such as photographic information and a photographing mode which accompany the image signal, in the form of a character or a sign.

The recording part 44 receives an output signal from the video signal processing part 42 and records an image signal and photographic information and the like accompanying the image signal (hereinafter referred to as an image signal and the like) in a predetermined form.

Figure 3:
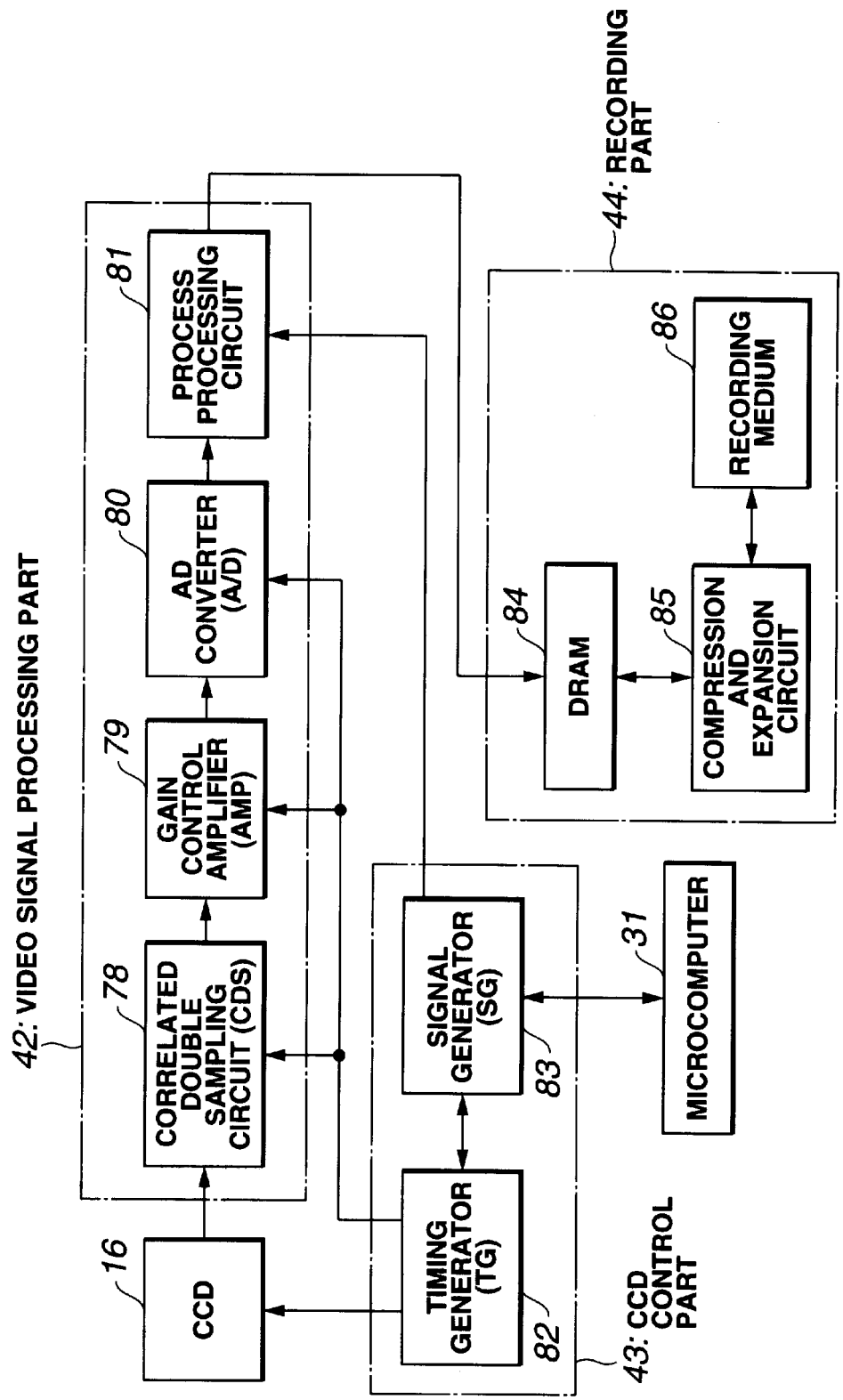
FIG. 3 is a block diagram showing a video signal processing part, a recording part and some of the essential electrical circuits electrically connected to these parts in the electronic image pickup apparatus shown in FIG. 1.

The details of the video signal processing part 42, the recording part 44 and the CCD control part 43 will be described below with reference to FIG. 3.

The video signal processing part 42 includes a correlated double sampling circuit (hereinafter referred to as a CDS) 78 which eliminates reset noise and the like from an image signal obtained by the CCD 16, a gain control amplifier (hereinafter referred to as an AMP) 79 which amplifies the output of the correlated double sampling circuit 78, an AD converter (hereinafter referred to as an A/D) 80 which receives the output (analog signal) of the AMP 79 and converts the analog signal into a digital signal, and a process processing circuit 81 which performs predetermined processing on the image signal which has been converted into the digital signal by the A/D 80.

The CCD control part 43 controls predetermined operations by outputting a driving signal to the CCD 16 as described above, and has the following construction.

The TG 82 which constitutes the CCD control part 43 generates a driving signal such as a transfer pulse for driving the CCD 16, as well as a sample-and-hold pulse for the correlated double sampling circuit 78 of the video signal processing part 42 and an AD conversion timing pulse for the A/D converter 80 of the same.

The SG 83 which constitutes the CCD control part 43 generates a signal for establishing synchronism between the TG 82 and the microcomputer 31.

The CCD control part 43 also plays the role of controlling the electronic shutter of the CCD 16, i.e., exposure time, during exposure in accordance with a command of the microcomputer 31 on the basis of the computational result of the light measuring and exposure computing part 45.

The recording part 44 is, as described above, constructed to receive an output signal from the video signal processing part 42 and store an image signal and photographic information and the like accompanying the image signal (hereinafter referred to as an image signal and the like) in a recording medium 86 as a predetermined form of image data file.

The recording part 44 includes a DRAM 84 which receives and temporarily stores an image signal and photographic information and the like which are outputted from the process processing circuit 81 of the video signal processing part 42, the recording medium 86 which stores the image signal and the like in its predetermined area as an image data file, and a compression and expansion circuit 85 which performs compression processing to process the image signal and the like inputted via the DRAM 84 to convert it into a signal optimum for recording on the recording medium 86 as the image data file, and which includes an expansion circuit which reads an image data file recorded on the recording medium 86 and processes the image data file to convert it into a signal optimum for reproduction display.

The detailed construction of the image pickup element of a first embodiment, i.e., the CCD 16, will be described below with reference to FIGS. 4 and 5.

The CCD 16 of the first embodiment is an interline charge transfer type of CCD. Plural photoconductive elements are arrayed on the photoconductive surface of the CCD 16, and each of the photoconductive elements forms one pixel.

Figure 4:
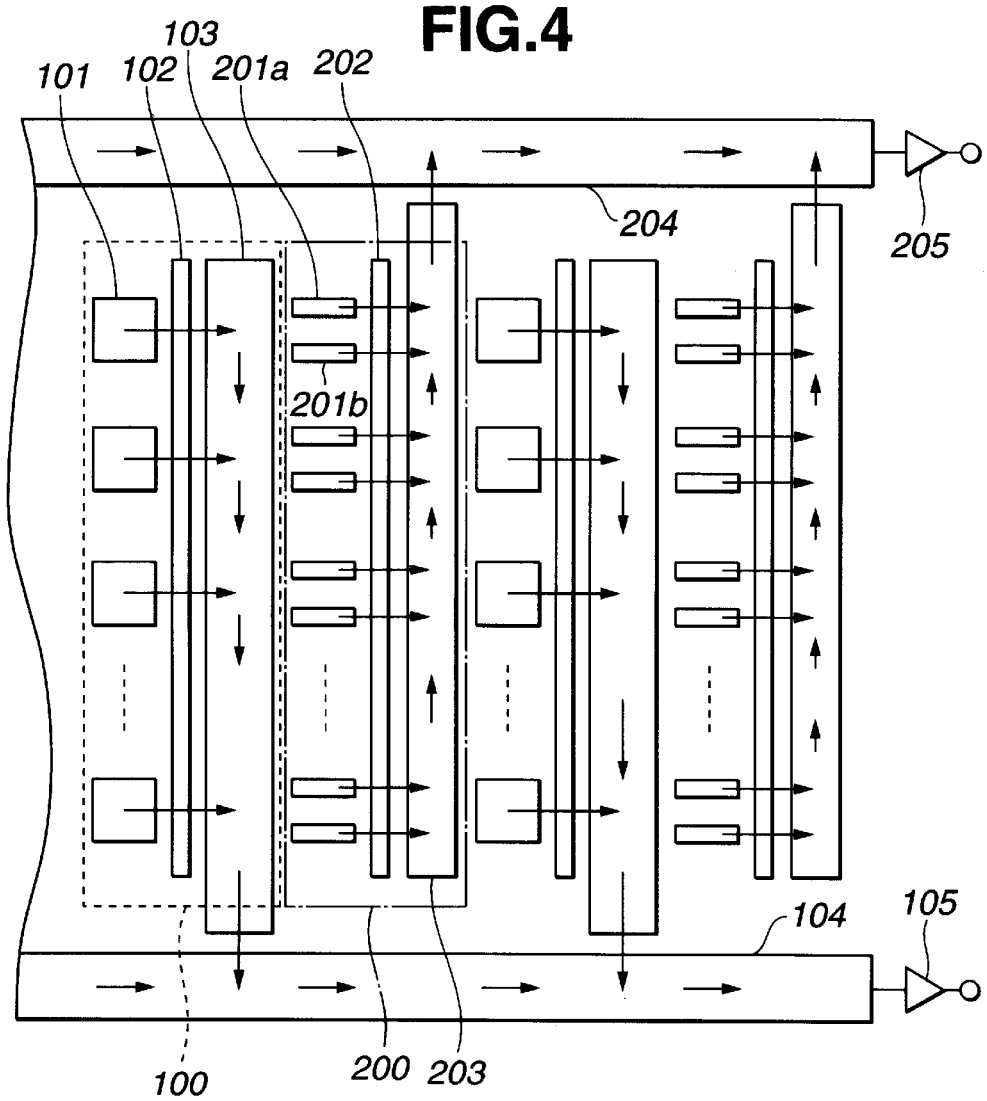
FIG. 4 is a partial enlarged view showing a portion of an image pickup element (CCD) of the first embodiment of the present invention.

The CCD 16 is functionally made of two parts, i.e., an image pickup part 100 which uses individual pixel signals for the purpose of picking up an image, and a focus detecting part 200 which uses such individual pixel signals for the purpose of detecting focus, and the individual pixel signals constitute the whole of an image signal obtained as shown in FIG. 4. The image pickup part 100 and the focus detecting part 200 are alternately disposed in columns.

The image pickup part 100 of the CCD 16 includes photodiodes 101 which constitute a first photoconductive element group disposed two-dimensionally in the horizontal and vertical directions, a transfer gate 102 which transfers the charge (a first video signal) stored in the photodiodes 101 to a vertical shift register 103, which sequentially transfers the transferred charge in the vertical direction, a horizontal shift register 104 which sequentially transfers the charge transferred vertically by the vertical shift register 103 in the horizontal direction, and an output part 105 which converts the charge transferred horizontally by the horizontal shift register 104 into a voltage signal and outputs the voltage signal.

The focus detecting part 200 is adjacent to the image pickup part 100 and is arrayed to alternate with the image pickup part 100. The focus detecting part 200 includes plural pairs of photodiodes 201a and 201b which constitute a second photoconductive element group disposed two-dimensionally in the horizontal and vertical directions. The photodiodes 201a and 201b constitute each of the plural pairs receive light beams divided by a microlens (which is not shown in FIG. 4, but will be described later in detail) which constitutes part of a small lens group disposed in front of the photoconductive elements. The focus detecting part 200 also includes a transfer gate 202 which transfers the charge (a second video signal) stored in the pairs of photodiodes 201a and 201b to a vertical shift register 203, which sequentially transfers the transferred charge in the vertical direction, a horizontal shift register 204 which sequentially transfers the charge transferred vertically by the vertical shift register 203 in the horizontal direction, and an output part 205 which converts the charge transferred horizontally by the horizontal shift register 204 into a voltage signal and outputs the voltage signal.

The reason why the vertical shift register 103, the horizontal shift register 104 and the output part 105 for the image pickup part 100 and the vertical shift register 203, the horizontal shift register 204 and the output part 205 for the focus detecting part 200 are disposed separately from each other is to optimally set their respective electrical characteristics with respect to signal charge quantities to improve their respective transfer efficiencies.

Figure 5:
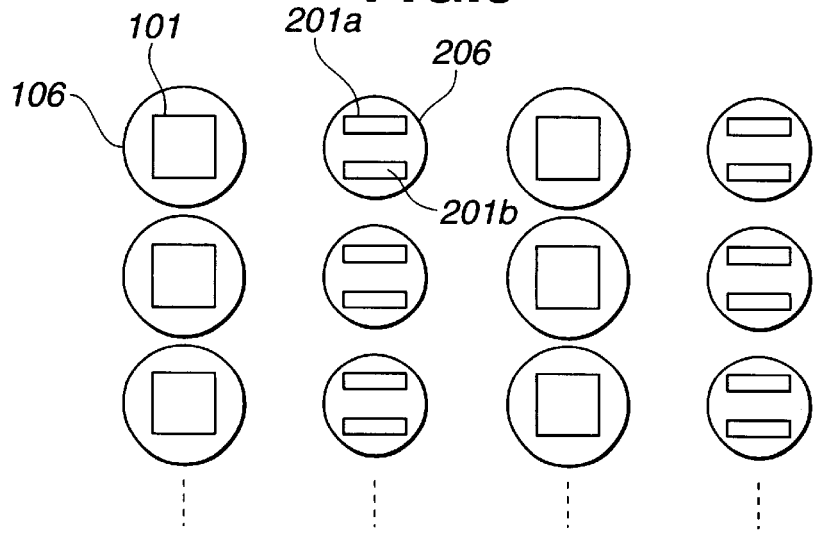
FIG. 5 is a partial enlarged view showing some of photodiodes and microlenses in the image pickup element (CCD) shown in FIG. 4.

First microlens array 106 and second microlens array 206 are respectively disposed in front of the corresponding photoconductive elements (the photodiodes 101, 201a and 201b), i.e., in front of the photoconductive surface of the CCD 16, as shown in a partial enlarged view of FIG. 5. The first microlens array 106 are respectively disposed for the corresponding photoconductive elements to improve the optical sensitivity of the image pickup element (the CCD 16).

Since the microlenses of the first microlens arrays (106) are disposed in this manner in front of the corresponding photoconductive elements, i.e., in front of the surface of the CCD 16 on which subject light beams are to be made incident, it is possible to realize the advantage of efficiently converging incident light. Such a construction is generally put into practice, and is called on-chip microlens.

In each of the image pickup parts 100, the first microlens array 106 is set so that the optical sensitivity becomes optimum in the above-described manner. The microlenses of the second microlens array 206 which correspond to the focus detecting parts 200 have optical characteristics different from those of the first microlens array 106, and each of the microlenses second microlens array 206 plays the role of dividing incident light into light beams to be made incident on the photodiodes 201a and 201b (as will be described later in detail).

The detailed construction of a horizontal cross section of the solid-state image pickup element (CCD) of the first embodiment in which the on-chip microlens is formed will be described below with reference to FIG. 6.

The CCD 16 is constructed as follows. A semiconductor substrate 131 is made of, for example, a silicon material, and charge transfer parts 132 each of which is made from a diffusion layer or the like and constitutes the vertical shift register 103 and the photodiodes 101 which constitute the respective photoconductive elements are formed in the inside of the semiconductor substrate 131.

A transparent flattening layer 136 is formed over the charge transfer parts 132 and the photodiodes 101, and in the inside of the transparent flattening layer 136, vertical transfer electrodes 134 are formed above the respective charge transfer parts 132 with insulating films (not show) interposed therebetween. Light blocking films 135 are formed to cover the respective vertical transfer electrodes 134.

The respective photodiodes 101 are formed to correspond to the openings of the light blocking films 135, and a color filter 137 is formed above the photodiodes 101 and the light blocking films 135, i.e., on the top side of the transparent flattening layer 136.

The transparent flattening layer 136 is further formed on the top side of the color filter 137, and microlenses each made of a spherical lens having a predetermined radius of curvature r and a focal length f1, i.e., the first microlens array 106, are disposed in the state of being formed integrally with the transparent flattening layer 136.

The image pickup parts 100 (refer to FIG. 4) of the CCD 16 which is the image pickup element of the first embodiment are constructed in this manner. Incidentally, the construction of the above-described portion is approximately identical to that of a related-art general image pickup element having on-chip microlenses.

Figure 6:
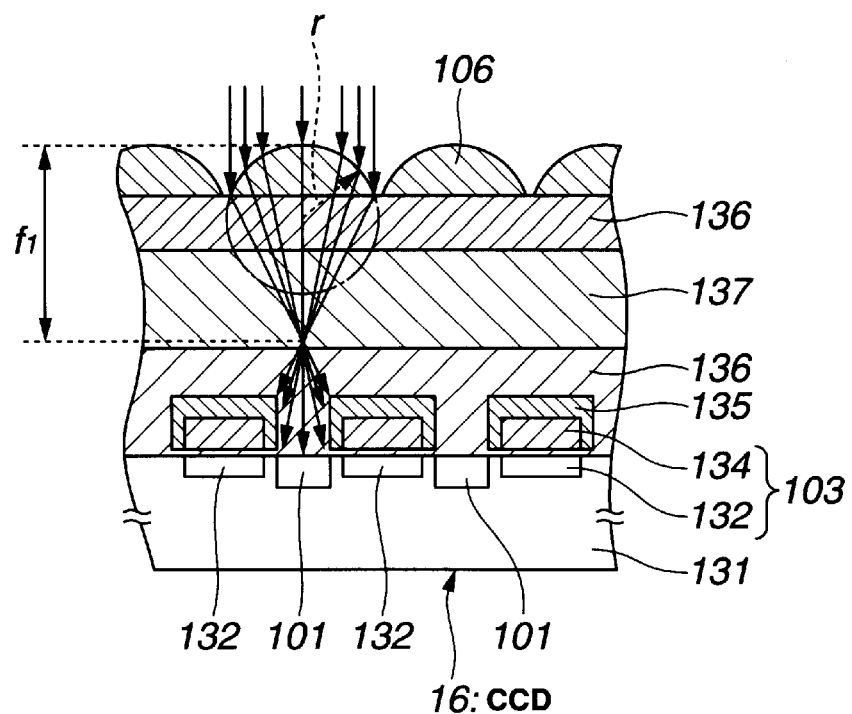
FIG. 6 is a cross-sectional view taken in the horizontal direction of a solid-state image pickup element (CCD) of the first embodiment (in a direction perpendicular to the transfer direction of a vertical shift register), showing the detailed construction of the solid-state image pickup element.

As shown in FIG. 4 and others, in the CCD 16 of the first embodiment, in addition to the construction shown in FIG. 6, the focus detecting parts 200 and the second microlens arrays which correspond to them 206 are disposed in a predetermined arrangement.

The second microlens arrays 206 which correspond to the focus detecting parts 200 are formed to differ from the first microlens arrays 106 (139) of the image pickup parts 100 in optical characteristic such as radius of curvature and focal length. The photodiodes 201a and 201b which constitute one pair of photoconductive elements are disposed at a focal plane of each of the second microlens arrays 206.

Figure 7:
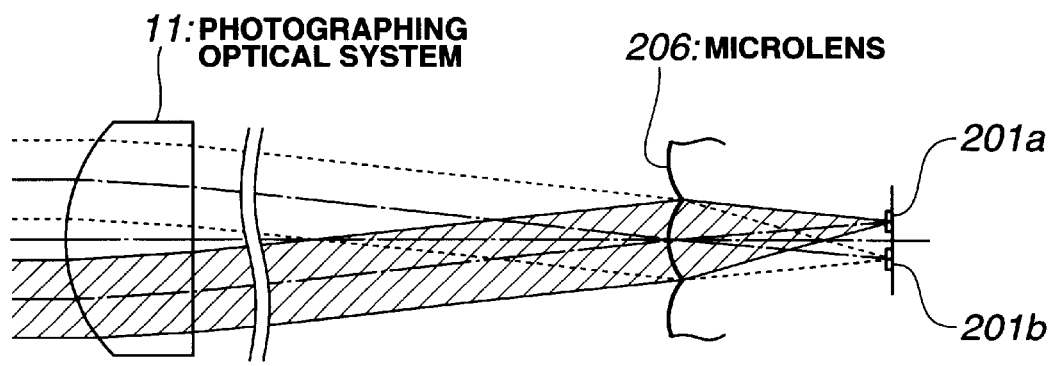
FIG. 7 is a view showing the manner in which, in the electronic image pickup apparatus shown in FIG. 1, a light beam transmitted through a photographing optical system is divided into two light beams by pupils of a microlens and the two light beams are made incident on a pair of photodiodes.

As shown in FIG. 7, each of the microlenses of the second microlens array 206 is formed to receive a light beam transmitted through the photographing optical system 11, divide the light beam into two light beams through its divided pupils, and make the respective light beams incident on a pair of photodiodes 201a and 201b.

The principle of the focus detecting operation performed by the CCD 16 of the first embodiment constructed in this manner is similar to the phase-difference detecting method disclosed in the above-cited Japanese Patent Publication No. 49841/1982 and the like. Accordingly, since the focusing detecting operation is based on a general method, the detailed description thereof is omitted herein.

Three cases in which a subject image formed by light beams incident on the focus detecting part 200 of the CCD 16 is in an in-focus state, in a front-focus state and in a rear-focus state will be described below on the basis of the model of the CCD 16 shown in FIG. 8.

Figure 8:
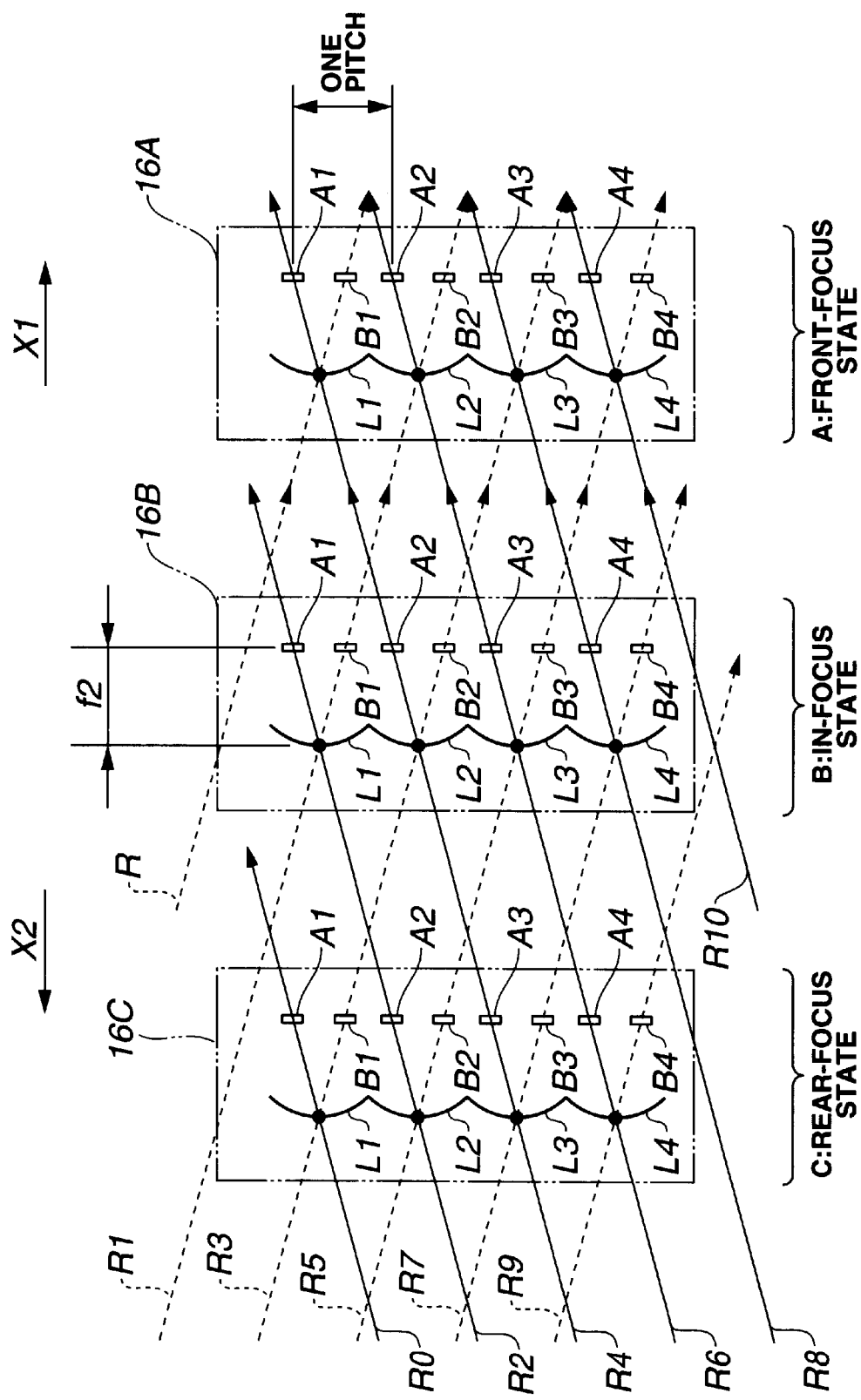
FIG. 8 is a diagram of the optical paths of light beams which enter a focus detecting part of the image pickup element (CCD) shown in FIG. 4.

In FIG. 8, optical paths relative to each of the in-focus state, the front-focus state and the rear-focus state are shown in one drawing, and the in-focus state is denoted by symbol B of FIG. 8 (a CCD 16B), the front-focus state is denoted by symbol A of FIG. 8 (a CCD 16A), and the r ear-focus state is denoted by symbol C of FIG. 8 (a CCD 16C).

In FIG. 8, for the convenience of description, each of the states is shown on the assumption that the image pickup element (the CCD 16) moves in the direction of an arrow X1 or an arrow X2 with the photographing optical system being fixed. However, actually, in the electronic image pickup apparatus to which the image pickup element (the CCD 16) of the first embodiment is applied, the image pickup element (the CCD 16) is fixed so that the focusing lens 11a of the photographing optical system 11 makes adjustment of the state of focus by moving in the direction of the optical axis (refer to FIG. 1).

In addition, in FIG. 8, the microlenses of the second microlens arrays 206 which constitutes part of the CCD 16 are shown as L1, L2, ..., Ln, and the photodiodes 201a and 201b which are photoconductive elements are respectively shown as A1, A2, ..., An and B1, B2, ..., Bn.

The focal length of the microlens Ln is set to f2, and this focal length is set to be approximately equal to the distance between the microlens Ln and the photodiodes An and Bn.

In the case of the in-focus state, as shown in a portion denoted by symbol B in FIG. 8 (the CCD 16B), rays R1 and R2, R3 and R4, ..., which are light beams emitted from the same subject, pass through different exit pupils of the microlenses Ln enter respective microlenses Ln, and the light quantities received by the respective photodiodes An and Bn, which are adjacent to each other about the optical axis of each of the microlenses Ln, coincide with each other.

For example, the rays R3 and R4 enter the microlens L2, and each of the rays R3 and R4 is divided into two light beams by different exit pupils of the microlens L2 and the respective light beams are received by the photodiodes B2 and A2. At this time, the light quantities received by the respective photodiodes B2 and A2 coincide with each other.

The case of the front-focus state is as shown in a portion denoted by symbol A in FIG. 8 (the CCD 16A). Specifically, light beams which are respectively transmitted through different ones of the microlenses Ln reach non-adjacent ones of the photodiodes An and Bn, so that the light quantities received by the photodiodes An and Bn which are not adjacent to each other coincide with each other.

For example, the respective rays R3 and R4 emitted from the same subject enter the microlenses L3 and L1 and are received by the photodiodes B1 and A3. Accordingly, in this case, an image deviation for two pitches occurs in a formed image.

The case of the rear-focus state is as shown in a portion denoted by symbol C in FIG. 8 (the CCD 16C). Specifically, although light quantities coincide between adjacent ones of the photodiodes An and Bn, rays transmitted through different ones of the microlenses Ln enter the adjacent photodiodes An and Bn.

For example, the respective rays R3 and R4 emitted from the same subject enter the microlenses L3 and L1 and are received by the photodiodes B3 and A1. Accordingly, in an image formed at this time, an image deviation for two pitches occurs in the opposite direction to the direction in which the image deviation occurs in the case of the above-described front-focus state.

Actually, it is impossible to ensure high focus detection accuracy with an image deviation quantity (phase difference) which occurs in units of one pitch. For this reason, processing such as a predetermined interpolation computation is performed so that focus detection of one pitch or less is performed. Incidentally, since the predetermined interpolation computation uses means which have heretofore generally been used in practice, the detailed description of the predetermined interpolation computation is omitted herein.

In this manner, by detecting an image deviation quantity, it is possible to find the in-focus position of the photographing optical system.

As described previously, the color filter 137 is disposed in front of the photodiodes 101 which constitute the image pickup parts 100 (refer to FIG. 6). The array of color elements of the color filter 137 is a so-called Bayer matrix (refer to FIG. 9).

The CCD 16 of the first embodiment is, actually, constructed in such a manner that the image pickup part 100 and the focus detecting part 200 are alternately disposed as described previously. However, for the convenience of description, FIG. 9 shows the array of the color elements on the light receiving surface of the color filter 137 which corresponds to an image pickup element in which only the image pickup parts 100 are arrayed two-dimensionally, and a portion corresponding to the focus detecting part 200 is omitted.

Figure 9:
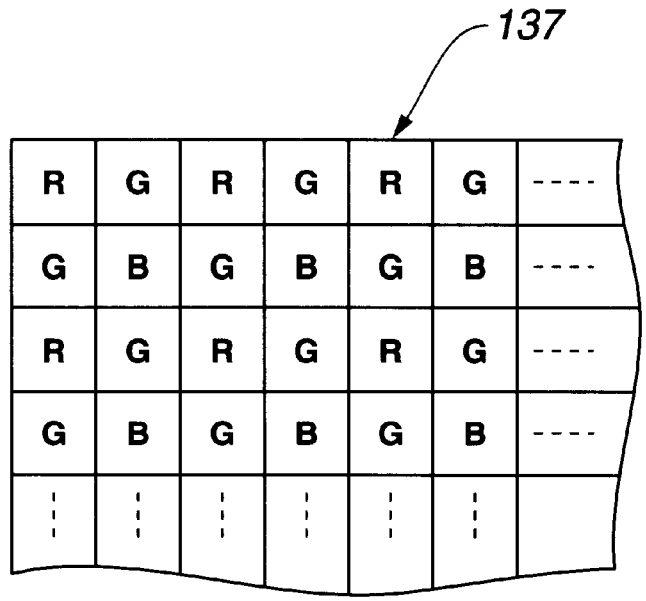
FIG. 9 is a view showing the array of color elements of a color filter in the image pickup element (CCD) shown in FIG. 4.

In FIG. 9, symbols R, G and B respectively denote color filter elements capable of selectively transmitting red, green and blue. The array is a general Bayer matrix, as shown in FIG.

Incidentally, in the CCD 16 of the first embodiment, no color filter is disposed in front of the pairs of photodiodes 201a and 201b of the focus detecting parts 200.

The CCD 16 of the first embodiment is constructed in the above-described manner.

Figure 10:
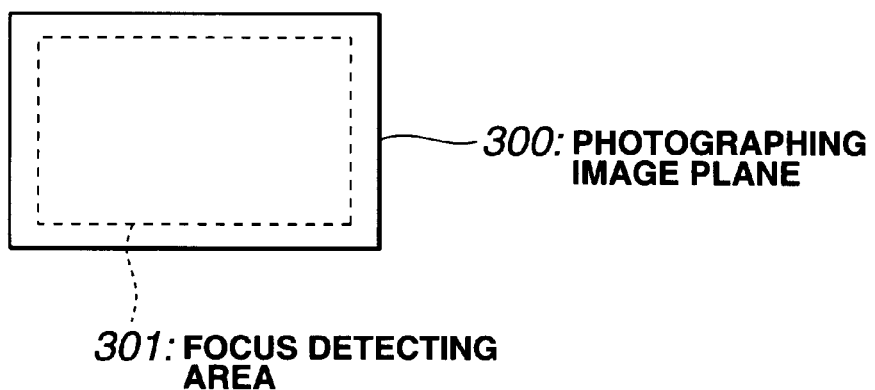
FIG. 10 is a view showing a focus detecting area with respect to a photographing image plane in the electronic image pickup apparatus shown in FIG. 1.

As described above, the photoconductive surface of the CCD 16 of the first embodiment is constructed in such a manner that the image pickup part 100 and the focus detecting part 200 are alternately disposed. Accordingly, the focus detecting part 200 is formed over approximately the whole of the photoconductive surface of the CCD 16. Thus, the electronic image pickup apparatus to which the CCD 16 of the first embodiment is applied is constructed so that approximately the whole of a photographing image plane 300 can be used as a focus detecting area 301 as shown in FIG. 10.

A photographer manipulates the area selecting switch 49 (refer to FIG. 2) to select a desired focus adjustment area and arbitrarily cause the present electronic image pickup apparatus to execute an automatic focus adjustment operation (hereinafter referred to as an AF operation). Since means for enabling the photographer to select a focus adjustment area through the area selecting switch 49 does not directly relate to the present invention, the detailed description of such means is omitted herein.

In the CCD 16 of the first embodiment, the image pickup part 100 and the focus detecting part 200 are disposed to extend vertically in the photographing image plane 300. Accordingly, the construction of the CCD 16 of the first embodiment makes it easy to detect the focus of a subject which has contrast in the vertical direction of the photographing image plane 300, for example, a horizontal line.

Otherwise, the image pickup part 100 and the focus detecting part 200 may be disposed to extend, for example, laterally in the photographing image plane 300. This construction makes it easy to detect the focus of a subject which has contrast in the lateral direction of the photographing image plane 300, for example, a vertical line.

The operation of the electronic image pickup apparatus to which the CCD 16 of the first embodiment is applied will be described below.

The present electronic image pickup apparatus is activated when, for example, a manipulation for turning on a main power switch or a manipulation for inserting a battery is performed to start supplying electricity to an electrical circuit including the microcomputer 31, and then the sequence program stored in advance in the ROM 31b incorporated in the microcomputer 31 is executed.

Figure 11:
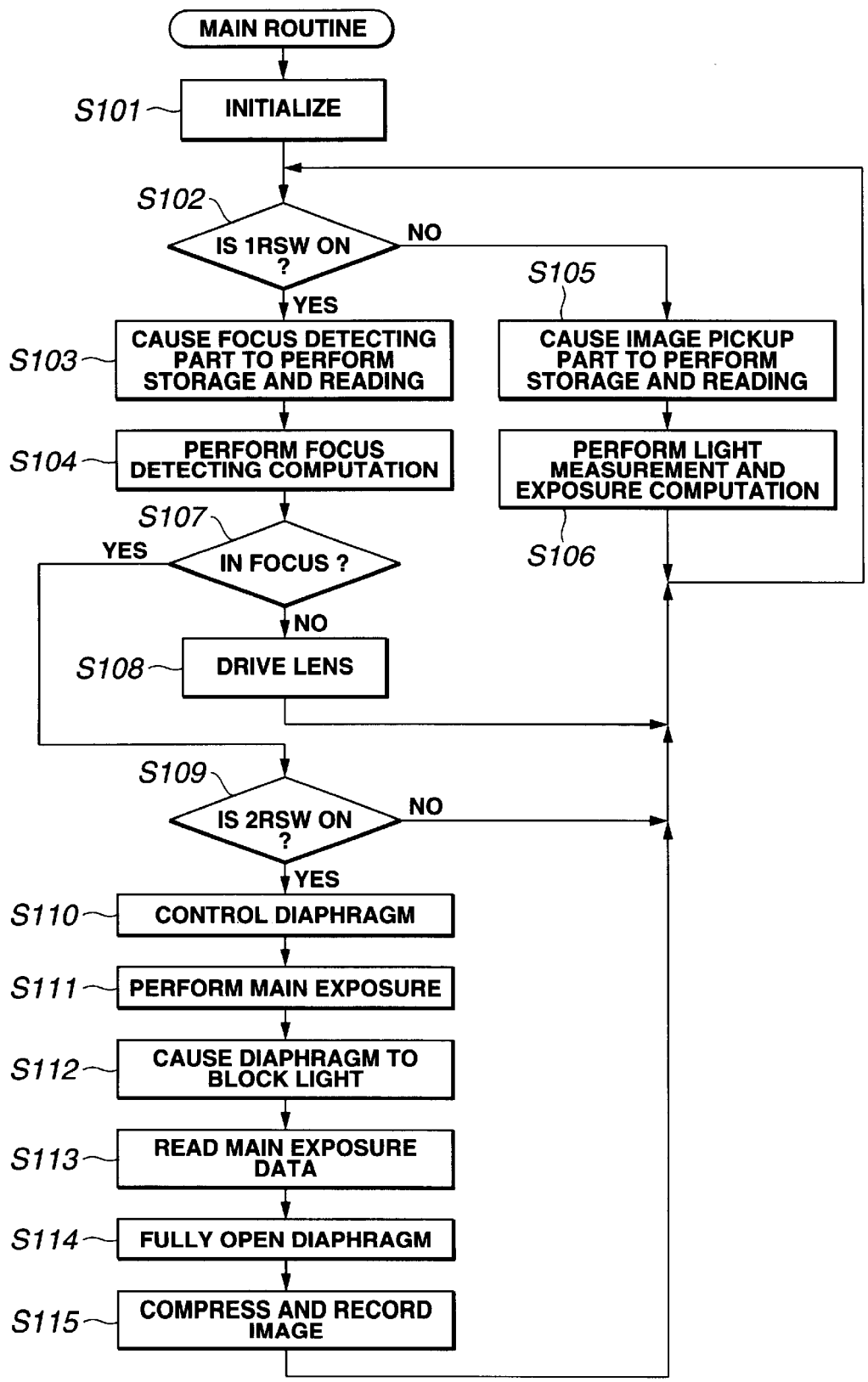
FIG. 11 is a flowchart showing the essential operation of control means in the electronic image pickup apparatus shown in FIG. 1.
Figure 12:
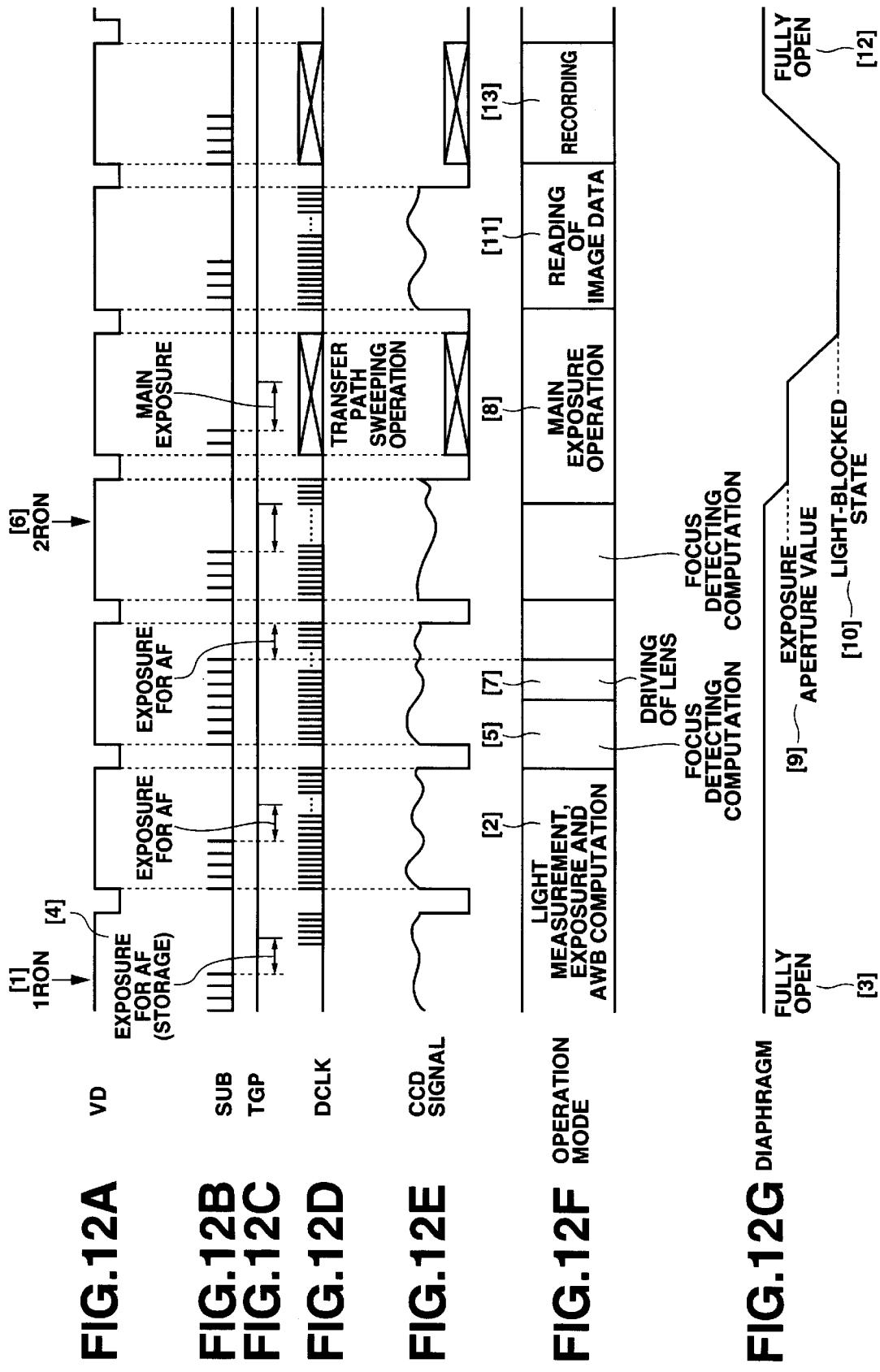
FIGS. 12A, 12B, 12C, 12D, 12E, 12F and 12G are timecharts of an image pickup operation to be executed by the electronic image pickup apparatus shown in FIG. 1.
Figure 13:
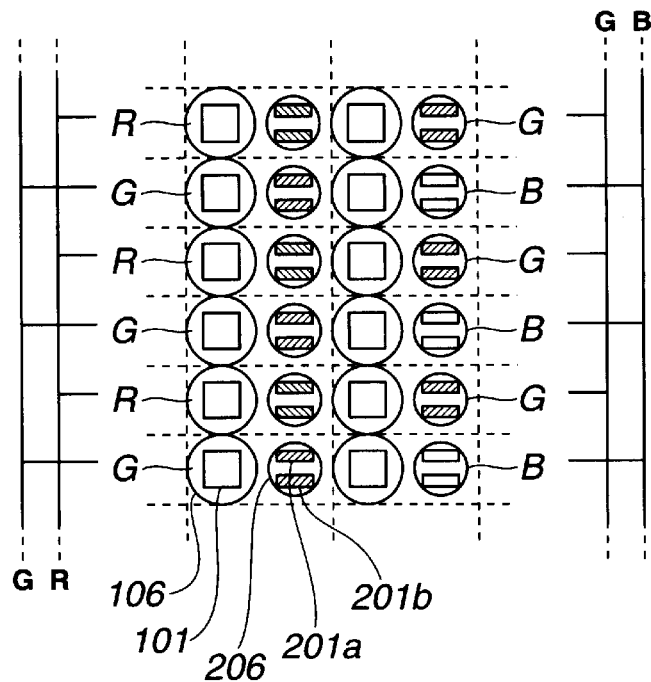
FIG. 13 is a view showing the construction of a color filter disposed in front of an image pickup element according to a second embodiment of the present invention.

First of all, in Step S101 of the flowchart of the main routine shown in FIG. 11, each electrical circuit block of the present electronic image pickup apparatus is initialized.

Then, in Step S102, the microcomputer 31 detects the state of the 1RSW 47 and checks whether the 1RSW 47 is turned on. If an on signal to be generated from the 1RSW 47 when a predetermined manipulating member is manipulated is detected in Step S102, the process proceeds to Step S103.

If the on signal to be generated from the 1RSW 47 is not detected, the process proceeds to Step S105. In Step S105, a series of light-measuring image pickup operations (hereinafter referred to simply as a light measuring operation), such as a storage (exposure) operation and a reading operation for the image pickup part 100 of the CCD 16, are performed, and the process proceeds to the next processing of Step S106.

In Step S106, the light measuring and exposure computing part 45 receives an image signal obtained by the CCD 16 (the image pickup part 100) and outputted from the video signal processing part 42, and executes predetermined light measuring and exposure computing processing. Through this processing, the light measuring and exposure computing part 45 calculates information which is needed during a main exposure operation (when image recording is being performed), i.e., optimum exposure information according to a subject, for example, an aperture value of the diaphragm part 12 and an electronic shutter speed of the CCD 16.

In other words, when the present electronic image pickup apparatus is activated, the light measuring operation is started at any time, and this light measuring operation is consecutively executed (refer to a section denoted by symbol [2] in the time chart shown in FIGS. 12A–12G). At this time, the diaphragm part 12 is fully open as indicated by symbol [3] in FIG. 12G.

On the other hand, if it is detected in Step S102 that the 1RSW 47 is turned on (refer to a section denoted by symbol [1] in FIG. 12A), the process proceeds to Step S103, in which the focus detecting part 200 of the CCD 16 is made to perform a storage operation (exposure for AF; refer to a section denoted by symbol [4] in FIG. 12B), and a predetermined image signal is read by using the focus detecting part 200. In the next step S104, a predetermined focus detecting computation is performed on the basis of the read image signal (refer to a section denoted by symbol [5] in FIG. 12F). Incidentally, the predetermined focus detecting computation executed in Step S104 is based on a general procedure to be executed by AF means for a related art electronic image pickup apparatus or the like, and the detailed description of the predetermined focus detecting computation is omitted herein.

In Step S107, it is determined whether the result of the focus detecting computation executed in Step S104 indicates an in-focus state or an out-of-focus state. If it is determined in Step S107 that the result indicates an in-focus state, the process proceeds to Step S109; whereas if it is determined in Step S107 that the result indicates an out-of-focus state, the process proceeds to Step S108.

In Step S108, the amount of movement of the focusing lens 11a which is required to achieve an in-focus state is calculated on the basis of the result of the focus detecting computation executed in Step S104, and the focusing lens 11a is driven (refer to a section denoted by symbol [7] in FIG. 12F). After that, the process returns to Step S102, and a similar AF operation is repeated.

In Step S109, the state of the 2RSW 48 is detected to check whether the 2RSW 48 is on. If it is detected in Step S109 that the 2RSW 48 is on (refer to a section denoted by symbol [6] in FIG. 12A), the process proceeds to the next processing of Step S110. If it is detected in Step S109 that the 2RSW 48 is off, the process returns to Step S102 and continues to perform the subsequent sequence while waiting for the 2RSW 48 to be turned on.

In Step S110 and the following steps, a so-called main exposure operation is executed (refer to a section denoted by symbol [8] in FIG. 12F).

First of all, in Step S110, the microcomputer 31 controls the diaphragm part 12 via the diaphragm driving part 33 to drive the diaphragm part 12 so that the exposure aperture value calculated in Step S106 is set (diaphragm control processing; refer to a section denoted by symbol [9] in FIG. 12G).

Then, in Step S111, the CCD control part 43 controls the CCD 16 to switch off a charge sweeping signal SUB and cause the CCD 16 to start a storage operation, and executes an exposure (main exposure) operation based on the electronic shutter speed value calculated by the exposure computing processing in Step S106 (refer to a section denoted by symbol [8] in FIG. 12F). The term "electronic shutter" used herein means the operation of causing the CCD control part 43 to generate charge transfer pulses TGP at predetermined timing according to an electronic shutter speed value and transfer the stored charge of the photodiodes 101 to the vertical shift register 103.

Then, in Step S112, to prevent a noise component such as a so-called smear from entering an image signal to be obtained, the diaphragm part 12 is driven in its closing direction by the diaphragm driving part 33 until the diaphragm part 12 is completely closed. (refer to a section denoted by symbol [10] in FIG. 12G). Thus, the photoconductive surface of the CCD 16 is brought to a light-blocked state.

Then, in Step S113, the CCD control part 43 outputs an image reading signal DCLK to the CCD 16 while retaining the light-blocked state of the CCD 16. Then, the video signal processing part 42 performs A/D conversion of an image signal (CCD signal) of the image pickup part 100 which is outputted in synchronism with the image reading signal DCLK, and reads the A/D-converted image signal (refer to a section denoted by symbol [11] in FIG. 12F).

Then, in Step S114, the microcomputer 31 transmits a predetermined fully open aperture command to fully open the diaphragm part 12 via the diaphragm driving part 33, thereby driving the diaphragm part 12 to reset it to its fully open state (refer to a section denoted by symbol [12] in FIG. 12G).

In addition, in Step S115, the video signal processing part 42 performs predetermined processing, such as compression processing, for converting the image signal obtained by the CCD 16 into a form optimum for recording, and then stores the processed image signal in a predetermined area of a recording medium 86 (refer to a section denoted by symbol [12] in FIG. 12G). After that, the above-described series of operations is completed, and the process returns to Step S102 and the subsequent processing is similarly repeated.

As described above, according to the first embodiment, a divided-pupil small lens group (the second microlens array 206) and pairs of photoconductive elements (the photodiodes 201a and 201b) which receive pupil-divided light beams are formed on the same chip as an image pickup element (the CCD 16), and a focus detecting operation is performed on the basis of the output signals from the photoconductive elements. Accordingly, since there is no need to add a new constituent member, it is possible to realize further reductions in cost and space, and it is also possible to realize a focus adjusting apparatus having far higher speed and far higher density.

Incidentally, in the above-described first embodiment, the color filter 137 is disposed in front of only the image pickup parts 100, and no color filter is disposed in front of the focus detecting parts 200. As a result, this construction is liable to increase the manufacturing costs of the image pickup element.

For this reason, in a second embodiment of the present invention which will be described below, a color filter is also disposed in front of the focus detecting parts 200.

As described previously, the array of the color elements of the color filter 137 in the image pickup element of the first embodiment is the Bayer matrix (refer to FIG. 9).

In the second embodiment, the construction of the color filter disposed in front of the image pickup element is a Bayer matrix similar to that shown in FIG. 9, but the color filter element contains color elements each of which covers both one of the photodiodes 101 of each of the image pickup parts 100 and an adjacent one of the pairs of photodiodes 201a and 201b of an adjacent one of the focus detecting parts 200.

In this manner, the second embodiment slightly differs from the first embodiment only in the construction of the color filter disposed in front of the image pickup element, and the other construction of the second embodiment is completely the same as that of the first embodiment.

In the image pickup element constructed in this manner, when a focus detecting computation is to be performed, control is executed so that only the image signals of photodiodes corresponding to color filter elements of the same color in the focus detecting parts 200 are used for the focus detecting computation.

In this case, the detection pitch becomes large, but it is possible to obtain three kinds of computational results by performing three computations for the respective colors (R, G and B). Accordingly, it is possible to prevent degradation of focus detection accuracy by applying predetermined computational processing such as averaging and weighting to the three kinds of computational results obtained in this manner.

In the image pickup element of the first embodiment, during photographing operation, only the output signal from the image pickup part 100 of the CCD 16 is handled as an image signal. However, in the image pickup element of the second embodiment, during photographing operation, the output signal from the focus detecting part 200 is also used as a video signal.

Specifically, when a photographing operation is to be performed by the electronic image pickup apparatus using the image pickup element of the second embodiment, the storage operation of the photodiodes 201a and 201b of the focus detecting part 200 is performed in addition to the storage operation of the photodiodes 101 of the image pickup part 100. At this time, an image signal obtained from a pair of photodiodes 201a and 201b is processed as a pair of pixel signals after having been subjected to addition processing.

Figure 14:
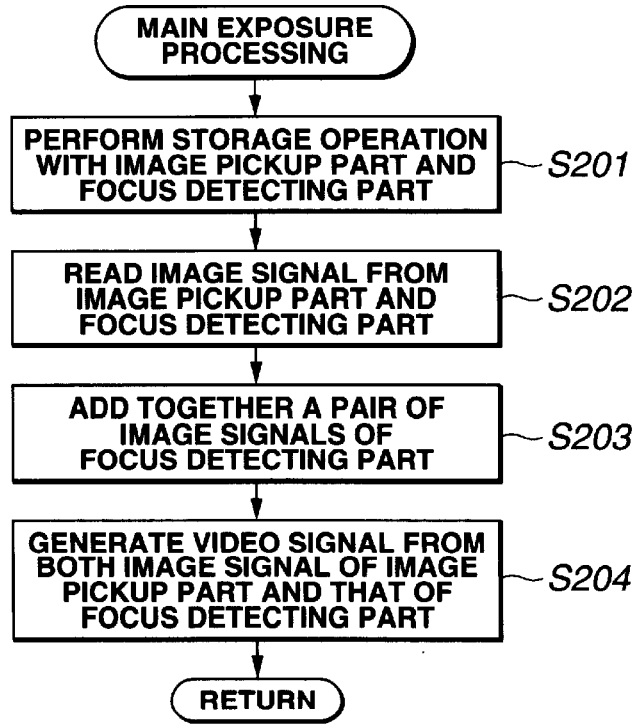
FIG. 14 is a flowchart showing the main exposure processing operations of a video signal processing part and a CCD control part in the image pickup element shown in FIG. 13.

The photographing operation (exposure operation) of the electronic image pickup apparatus using the image pickup element of the second embodiment, i.e., the main exposure processing operation of the video signal processing part and the CCD control part, will be described below with reference to FIG. 14. Incidentally, the sequence of this main exposure operation corresponds to Step S111 of FIG. 11.

First of all, in Step S201, predetermined storage operations are performed with the image pickup part 100 and the focus detecting part 200.

Then, in Step S202, the output image signals of the image pickup part 100 and the focus detecting part 200 are A/D converted and the digital image signals are read, and the process proceeds to the next processing of Step S203. In Step S203, predetermined addition processing is executed on a pair of pixel signals corresponding to the photodiodes 201a and 201b of the focus detecting part 200.

Then, in Step S204, a predetermined video signal is formed by using both the image signal of the image pickup part 100 and the image signal of the focus detecting part 200 which has been subjected to the addition processing. Thus, the above-described series of processing is completed (return).

Incidentally, in this sequence, the predetermined video signal may also be formed by performing correction processing on the added image signal of the respective photodiodes 201a and 201b by using the image signal of the photodiode 101 of the image pickup part 10.

In the processing of generating the video signal, for example, the video signal may be obtained by generating an interpolated video signal by interpolating the pixel signals of four photodiodes 101 which neighbor arbitrary photodiodes 201a and 201b, comparing the interpolated video signal with the above-described added video signal, and selecting a signal of higher reliability. Otherwise, averaging processing may also be performed on both the interpolated video signal and the added video signal so that the result of this processing is used as the video signal.

The addition processing for the photodiodes 201a and 201b may use not only processing means which adds together digital image data obtained by executing A/D conversion on obtained pixel signals, but also, for example, processing means which adds together charge signals in the inside of the vertical shift register 203.

According to the second embodiment constructed in this manner, the color filter is disposed over the front-side surfaces of all photoconductive elements which constitute the image pickup element. Accordingly, as compared with the image pickup element of the first embodiment, it is possible to simplify the manufacturing process without degrading the focus detection accuracy, whereby it is possible to readily realize further reductions in manufacturing costs.

In addition, since the color filter is disposed in front of the front surface of the focus detecting part 200 as well, the corresponding photodiodes 201a and 201b can be used for photographing operation. Accordingly, it is possible to readily increase horizontal resolution by about a two-fold level.

In the image pickup element of the first embodiment, as described previously, the image pickup part 100 and the focus detecting part 200 are disposed to extend in the vertical or lateral directions of the photographing image plane 300 (refer to FIG. 10). This construction makes it easy to perform focus detection on a subject which has contrast in either one of the vertical and lateral directions of the photographing image plane 300, for example, only either one of a horizontal line or a vertical line.

However, an image pickup element constructed so that variations in contrast can be detected in both vertical and lateral directions will be far more useful.

A third embodiment which is constructed to take this point into account will be described below.

Figure 15:
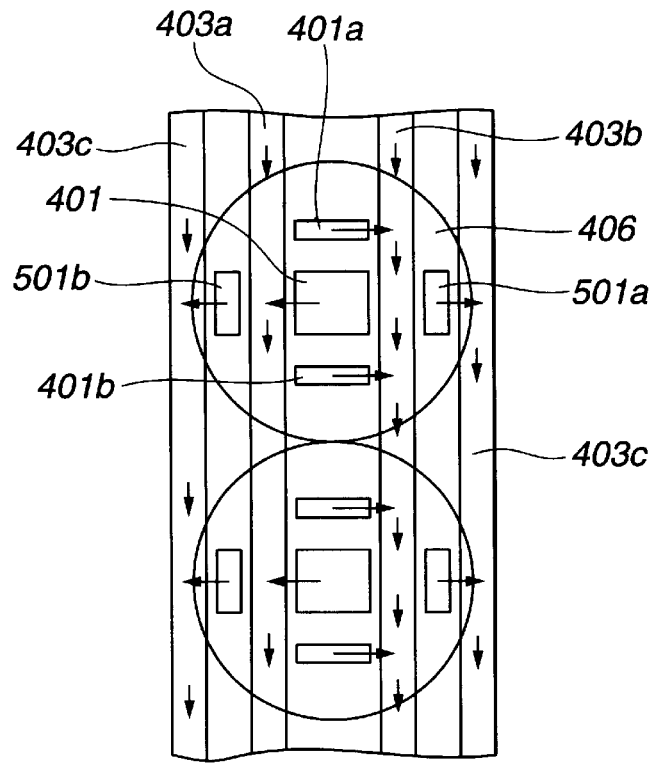
FIG. 15 is a partial enlarged view showing the essential portion of an image pickup element according to a third embodiment of the present invention.

An image pickup element according to the third embodiment of the present invention will be described below with reference to the partial enlarged view shown in FIG. 15.

Similarly to the image pickup element of the first embodiment, the image pickup element (CCD) of the third embodiment includes an image pickup part which performs an image pickup operation and a focus detecting part which executes focus detection. The image pickup part includes a photodiode 401 which is a photoconductive element for picking up an image and a vertical shift register 403a which receives the charge stored in the photodiode 401 and sequentially transfers the charge in the vertical direction.

The focus detecting part includes a pair of photodiodes 401a and 401b which are photoconductive elements to be used for detecting the focus of a horizontal line, a vertical shift register 403b which receives the charge stored in the pair of photodiodes 401a and 401b and sequentially transfers the charge in the vertical direction, a pair of photodiodes 501a and 501b which are photoconductive elements to be used for detecting the focus of a vertical line, and a vertical shift register 403c which receives the charge stored in the pair of photodiodes 501a and 501b and sequentially transfers the charge in the vertical direction.

A microlens array 406 which forms a subject image on the photoconductive surfaces of the respective photodiodes 401, 401a, 401b, 501a and 501b is disposed in front of the photoconductive surfaces of these five photodiodes. In the present image pickup element, a unit which includes the image pickup part, the focus detecting part and the microlens array 406 is constructed as one unit (one pixel).

The pair of photodiodes 401a and 401b for detecting the focus of a horizontal line is used to detect an image deviation which appears in the vertical direction of the photographing image plane, on the basis of an image signal obtained by one of plural pairs of similar photodiodes which are arrayed in the vertical direction of the photographing image plane 300 (refer to FIG. 10).

Similarly, the pair of photodiodes 501a and 501b for detecting the focus of a vertical line is used to detect an image deviation which appears in the horizontal direction of the photographing image plane, on the basis of an image signal obtained by one of plural pairs of photodiodes which are arrayed in the lateral direction of the photographing image plane 300 (refer to FIG. 10).

Figure 16:
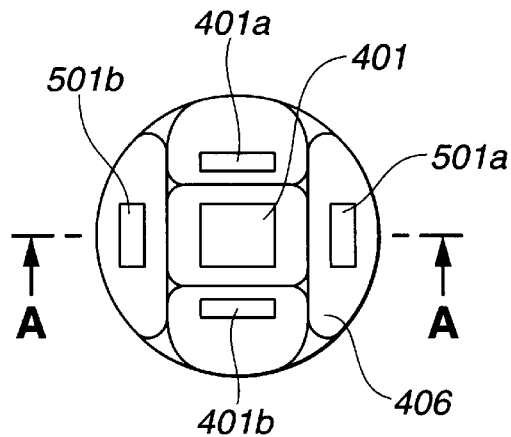
FIG. 16 is a partial enlarged view showing only one unit of the image pickup element shown in FIG. 15.
Figure 17:
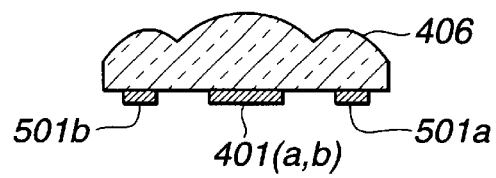
FIG. 17 is a vertical sectional view taken along line A—A of FIG. 16.

The microlens of a microlens array 406 has a shape in which five portions corresponding to the respective five photodiodes 401, 401a, 401b, 501a and 501b are integrally formed as shown in FIG. 16 in partial enlarged view, and the cross-sectional shape of the microlens array 406 is as shown in FIG. 17 in cross section.

In other words, the microlens array 406 is equivalent to a microlens array in which, for example, the first microlens array 106 and the second microlens array 206 used in the above-described first embodiment are integrally formed by a single member. Each of the microlenses of the microlens array 406 is formed so that its optical characteristics such as radius of curvature and focal length differ according to the corresponding five photoconductive elements (the photodiodes 401, 401a, 401b, 501a and 501b). The other construction of the third embodiment is approximately identical to that of the first embodiment.

A focus detecting operation to be executed by an electronic image pickup apparatus using the image pickup element (CCD) of the third embodiment constructed in this manner is approximately identical to that described above in connection with the first embodiment. However, the third embodiment differs from the first embodiment in that the pair of photodiodes 501a and 501b for detecting the focus of a vertical line is used to detect a horizontal image deviation in the photographing image plane, and according to circumstances, the pair of photodiodes 401a and 401b for detecting the focus of a horizontal line is used to detect a vertical image deviation in the photographing image plane.

Figure 18:
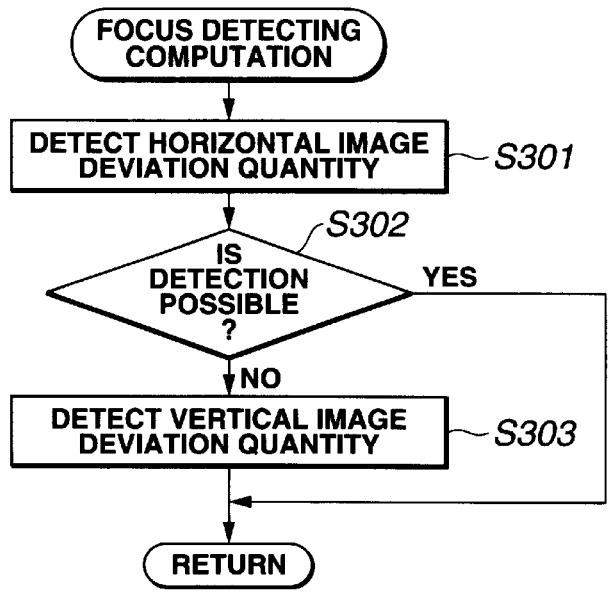
FIG. 18 is a flowchart showing the sequence of a focus detecting operation to be performed by an electronic image pickup apparatus using the image pickup element shown in FIG. 15.

The focus detecting operation to be performed by the electronic image pickup apparatus using the image pickup element of the third embodiment will be described below with reference to the flowchart shown in FIG. 18. Incidentally, the sequence of this focus detecting computation processing corresponds to Step S104 of FIG. 11.

Figure 19:
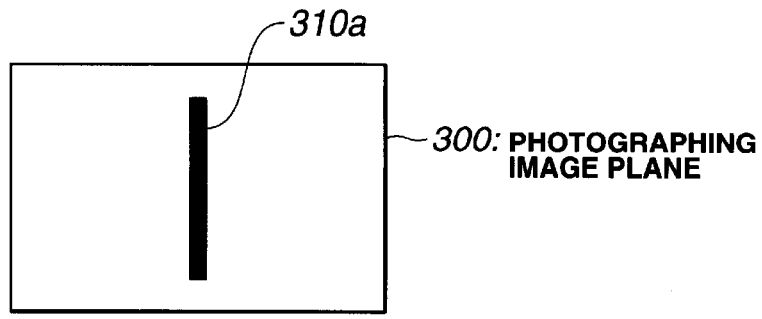
FIG. 19 is a view showing one example of a subject having contrast in the lateral (horizontal) direction of a photographing image plane.

First of all, in Step S301, a horizontal image deviation quantity in the photographing image plane is detected by using an image signal obtained by the photodiodes 501a and 501b arrayed in the lateral direction of the photographing image plane. In this case, the operation of detecting a horizontal image deviation quantity is performed on a subject such as that shown in FIG. 19, i.e., a subject 310a such as a vertical line having contrast in the lateral (horizontal) direction of the photographing image plane.

Then, in Step S302, a decision is made as to the detection result of the focus detecting operation executed in Step S301. In Step S302, if it is determined that it is sufficiently possible to detect a focus position from the result of the focus detection, it is determined that the detection result should be adopted, and the sequence of the above-described series of focus detecting operations is brought to an end. The process returns to the main routine (return).

On the other hand, if it is not determined in Step S302 that a desired detection result can be obtained from the focus detecting operation executed in Step S301, the process proceeds to Step S303.

Figure 20:
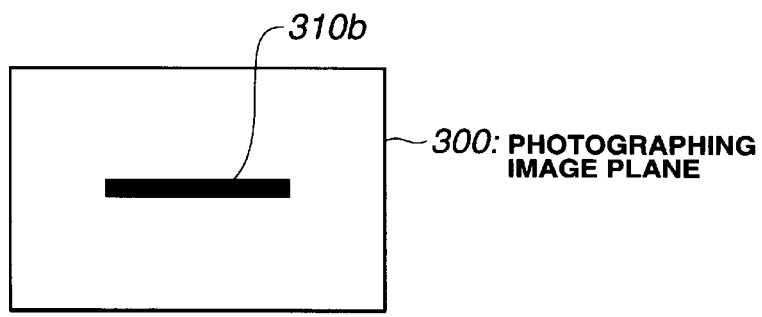
FIG. 20 is a view showing one example of a subject having contrast in the vertical (perpendicular) direction of the photographing image plane.

For example, with respect to a subject such as that shown in FIG. 20, i.e., a subject 310b such as a horizontal line having contrast in the vertical (perpendicular) direction of the photographing image plane, no sufficient focus detection result can be obtained with the photodiodes 501a and 501b which are arrayed in the lateral direction of the photographing image plane.

Therefore, in such a case, in Step S303, the operation of detecting a vertical image deviation quantity in the photographing image plane is performed on the basis of an image signal obtained from the photodiodes 401a and 401b which are arrayed in the vertical direction of the photographing image plane. Then, after it has been determined that the obtained detection result should be adopted, the sequence of the above-described series of operations is brought to an end, and the process returns to the main routine (return).

Subjects to be photographed during normal photography are largely classified into two kinds, i.e., the subject 310a (refer to FIG. 19) which has contrast in the lateral (horizontal) direction of the photographing image plane, and the subject 310b (refer to FIG. 20) which has contrast in the vertical (perpendicular) direction of the photographing image plane. In general, there is a tendency for the former type of subject to be encountered more often.

In view of this point, in the sequence of the focus detecting operation of the third embodiment, the processing of detecting a horizontal image deviation quantity is executed with priority as described above, and if a detection result sufficient to detect a focus position is obtained through this detection processing, the detection result is adopted to execute an automatic focus adjustment operation.

On the other hand, if no desired detection result is obtained through the first focus detecting operation relative to the horizontal image deviation quantity (Step S301 of FIG. 18), the processing of detecting a vertical image deviation quantity is executed as the second focus detecting operation.

As described above, according to the third embodiment, it is possible to obtain an advantage similar to that of the first embodiment.

In addition, since the focus detecting operation can be performed in both of the horizontal and vertical directions with respect to the photographing image plane, an electronic image pickup apparatus or the like to which the third embodiment is applied can readily perform a highly accurate focus detecting operation irrespective of the state of contrast of a subject in the photographing image plane during photography.

In addition, in the sequence of the focus detecting operation, since a horizontal image deviation quantity is detected with priority, a time lag or the like produced by the focus detecting operation can be reduced compared to the above-described first embodiment.

Moreover, in the sequence of the focus detecting operation, if the focus detecting operation is performed with respect to both of the horizontal and vertical directions, a detection result which appears to be more reliable is adopted to perform a focus adjustment operation, whereby a more accurate focus detecting operation can be achieved.

A fourth embodiment of the present invention will be described below.

Figure 21:
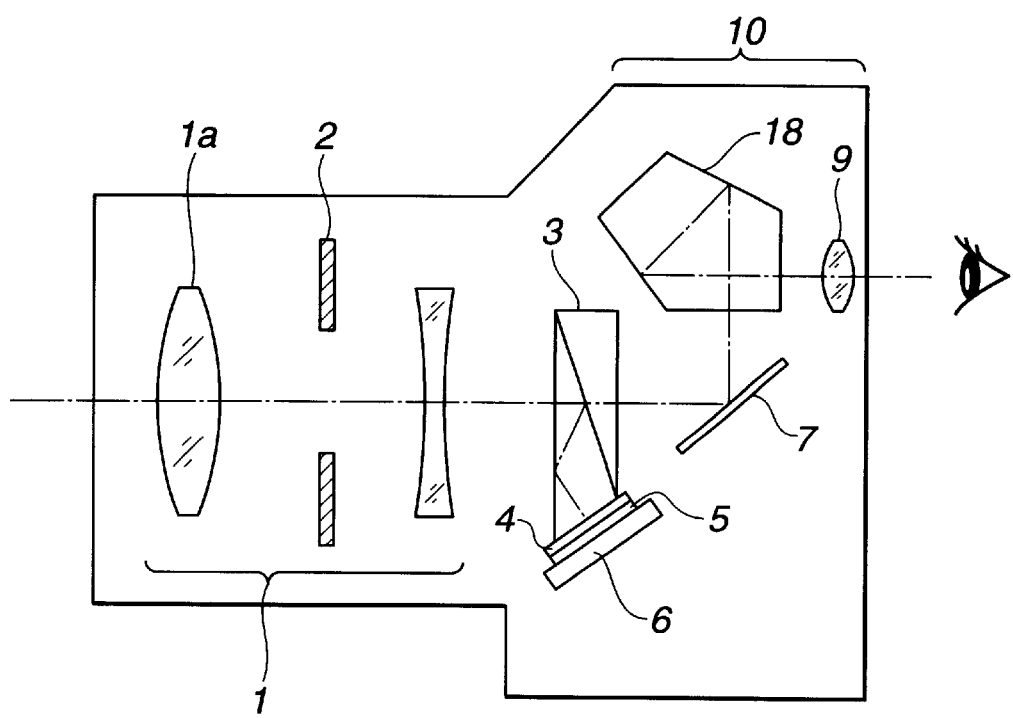
FIG. 21 is a block diagram of an optical system of an image pickup apparatus according to a fourth embodiment of the present invention.

FIG. 21 is a block diagram of the optical system of an image pickup apparatus according to a fourth embodiment of the present invention. Incidentally, FIG. 21 is approximately similar to FIG. 1 which shows the first embodiment. Accordingly, in FIG. 21, identical reference numerals are used to denote members identical to those shown in FIG. 1.

As shown in FIG. 21, a focusing lens 1a which receives incident subject light is disposed at a predetermined position, and a diaphragm 2 is disposed on the optical axis of the focusing lens 1a. The focusing lens 1a, the diaphragm 2 and the like constitute a photographing optical system 1. A beam splitter 3 is disposed on the optical path of the subject light which passes through the photographing optical system 1, and an infrared cut-filter 4, a low-pass filter (LPF) 5 and an image pickup element 6 are disposed on the optical path of light reflected by the beam splitter 3.

A viewfinder optical system 10 which includes a mirror 7, a pentagonal prism 18 and an eyepiece lens 9 is disposed on the optical path of light transmitted through the beam splitter 3.

Incidentally, the diaphragm 2 is capable of retaining a predetermined diaphragm aperture, and has a shutter function as well as the function of completely blocking light.

Figure 22:
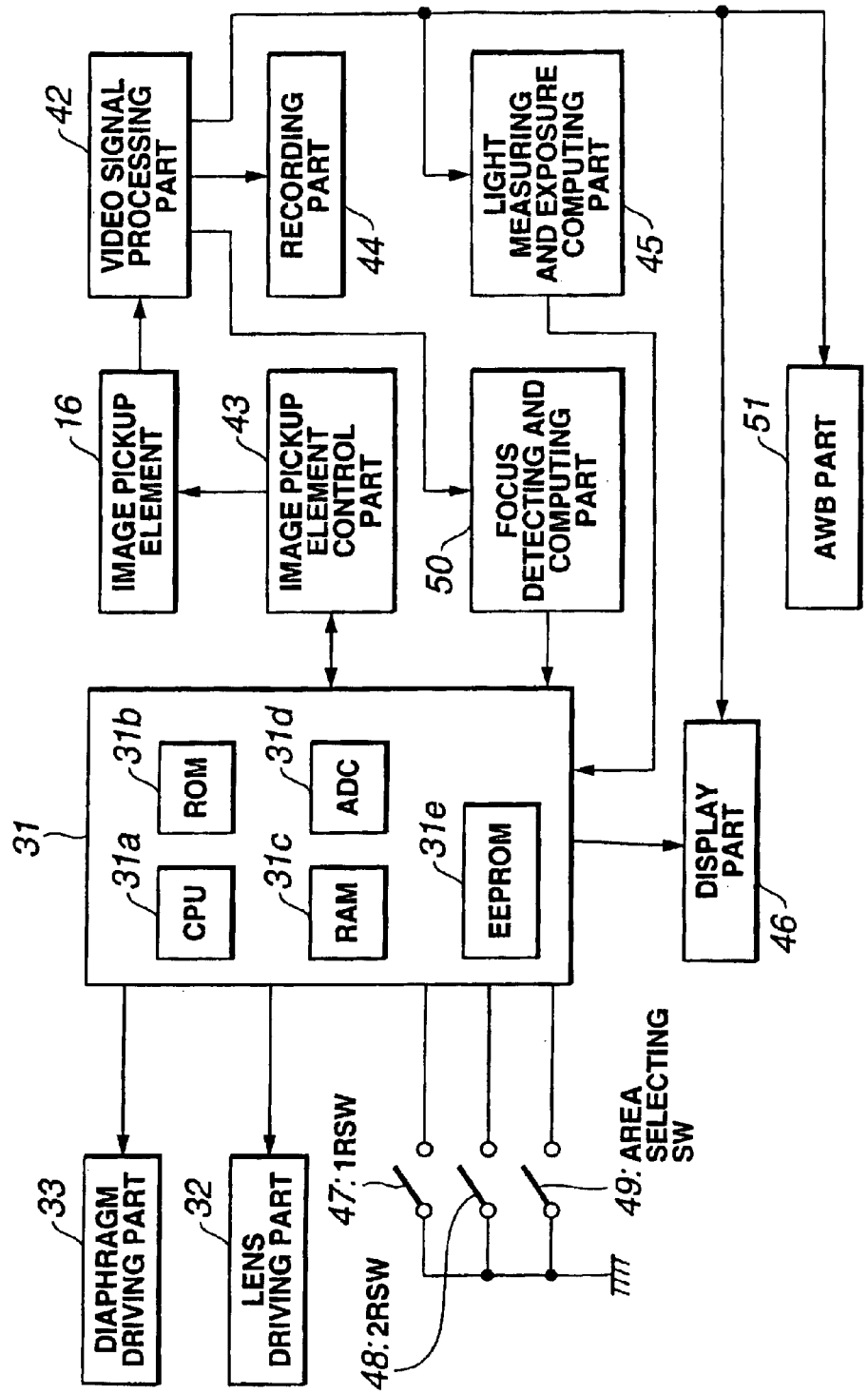
FIG. 22 is a block diagram showing an electrical system of the electronic image pickup apparatus according to the fourth embodiment.

In the above-described construction, part of a subject light beam which has passed through the photographing optical system 1 is reflected downward by the beam splitter 3, and infrared components are eliminated from the reflected subject light beam by the infrared cut-filter 4. After moiré has been reduced by the LPF 5, an image is picked up by the image pickup element 6. The part of the subject light beam that has been transmitted through the beam splitter 3 is reflected by the mirror 7 and is conducted to the viewfinder optical system 10 made of the pentagonal prism 18, the eyepiece lens 9 and the like, whereby an image is observed by a photographer. FIG. 22 is a block diagram of the electrical system of the image pickup apparatus according to the fourth embodiment of the present invention. Incidentally, FIG. 22 is approximately similar to FIG. 2 which shows the first embodiment.

As shown in FIG. 22, the microcomputer 31 has at least the central processing unit (CPU) 31a which exerts control over the entire image pickup apparatus, the read-only memory (ROM) 31b, the random access memory (RAM) 31c, the analog/digital converter (ADC) 31d, and the EEPROM 31e which is a non-volatile memory.

The microcomputer 31 is also electrically connected to the lens driving part 32, the diaphragm driving part 33, the image pickup element control part 43, the display part 46, the first release switch (1RSW) 47, the second release switch (2RSW) 48 and the area selecting SW 49.

The output of the image pickup element control part 43 is connected to the input of the image pickup element 16 (which is identical to the image pickup element 6 of FIG. 21), and the output of the image pickup element 16 is connected to the input of the video signal processing part 42. The output of the video signal processing part 42 is connected to the input of each of the recording part 44, the light measuring and exposure computing part 45, the display part 46, the focus detecting and computing part 50 and the automatic white balance (AWB) part 51.

The output of the light measuring and exposure computing part 45 and the output of the focus detecting and computing part 50 are connected to an input of the microcomputer 31.

In the above-described construction, the microcomputer 31 performs a series of operations in accordance with the sequence program stored in the ROM 31b included in the microcomputer 31. Correction data peculiar to individual cameras and associated with focus adjustment, light measuring and exposure computation, AWB and the like are stored in the EEPROM 31e included in the microcomputer 31. The image pickup element 6 picks up a subject image formed by the photographing optical system 1 and converts the subject image into an electrical signal.

The video signal processing part 42 processes the electrical signal which is a pixel signal supplied from the image pickup element 6, thereby forming a video signal. The detailed construction of the video signal processing part 42 will be described later.

The light measuring and exposure computing part 45 calculates a measured light value and an exposure control value on the basis of a video signal processed in the video signal processing part 42. The image pickup element control part 43 controls the electronic shutter of the image pickup element 6 during photography on the basis of a shutter speed which is an output from the light measuring and exposure computing part 45. In the fourth embodiment, the diaphragm 2 in the photographing optical system 1 is controlled during photography on the basis of aperture value data calculated by an exposure computation performed by the light measuring and exposure computing part 45.

The diaphragm driving part 33 drives the diaphragm 2 on the basis of a command sent from the microcomputer 31. The focus detecting and computing part 50 performs a focus detecting computation on the basis of the video signal processed in the video signal processing part 42. The result of the focus detecting computation, such as focus decision data or the driving quantity of the focusing lens, are transmitted to the microcomputer 31.

The AWB part 51 automatically controls white balance on the basis of the video signal processed in the video signal processing part 42. The display part 46 displays a video image picked up by the image pickup element 6 and information about the interior of the camera, under the control of the microcomputer 31 by means of a liquid crystal display (LCD) or the like.

The 1RSW 47 and the 2RSW 48 are switches which are interlocked with a release button, and when the release button is depressed to a first stroke position, the 1RSW 47 is turned on, and when the release button is depressed to a second stroke position, the 2RSW 48 is turned on. The area selecting switch 49 is a switch for selecting an AF area, and each time the area selecting switch 49 is turned on, selection is moved from the current AF area to the next predetermined AF area. The microcomputer 31 performs light measurement and an AF operation when the 1RSW 47 is turned on, and performs an exposure operation and an image recording operation when the 2RSW 48 is turned on.

In addition, the lens driving part 32 drives the focusing lens 1a on the basis of a command sent from the microcomputer 31.

Figure 23:
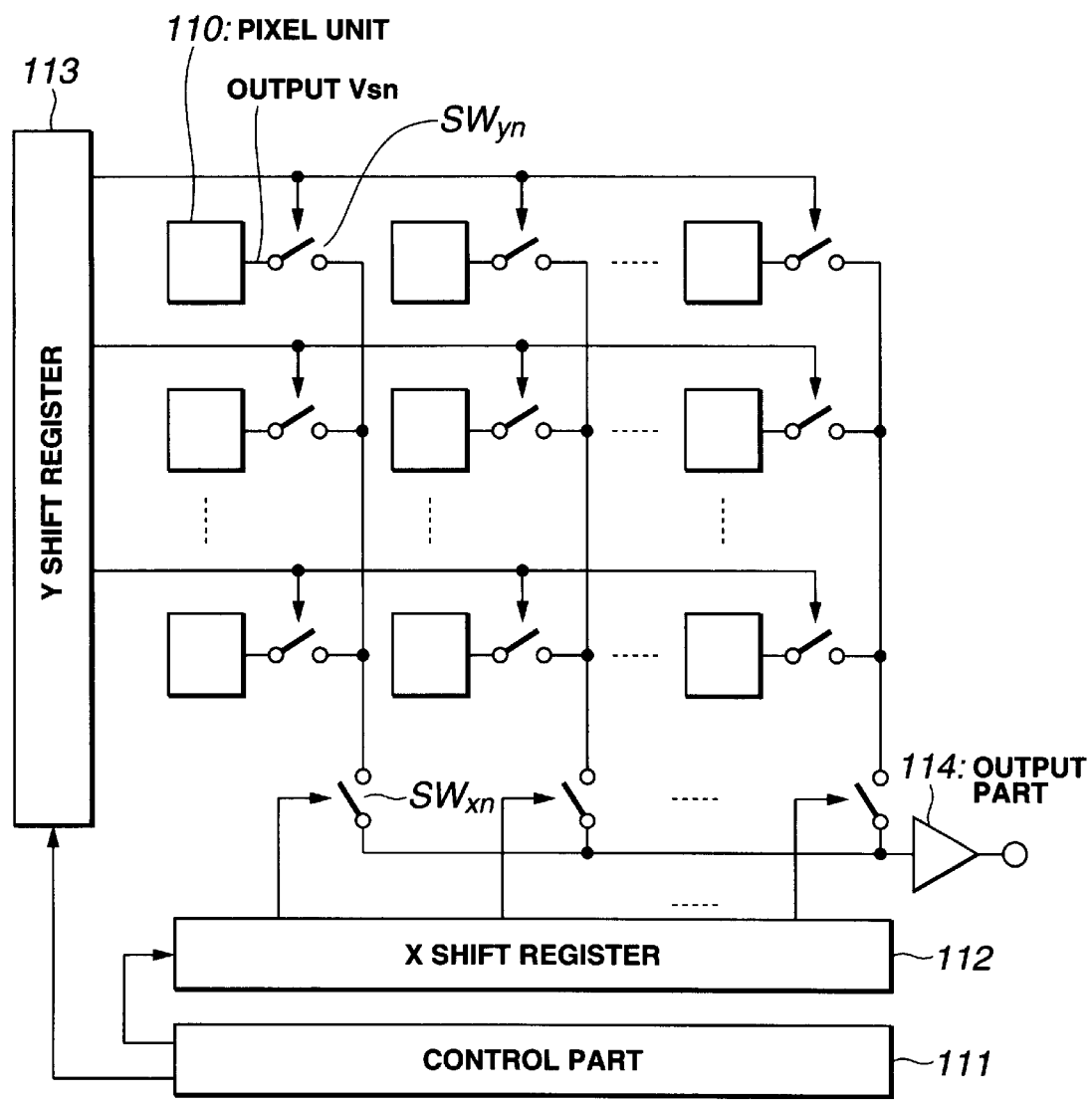
FIG. 23 is a view showing the detailed construction of an image pickup element according to the fourth embodiment.

FIG. 23 is a block diagram showing the detailed construction of the image pickup element 6.

As shown in FIG. 23, the image pickup element 6 which is a MOS type sensor has a construction in which plural pixel units 110 each including a photodiode which is a photoconductive element are two-dimensionally arrayed and the storage operations of the respective pixel units 110 are controlled by a control part 111. The control part 111 controls an X shift register 112 and a Y shift register 113 to select an output Sn of a pixel unit through corresponding switches SWxn and Swyn, and outputs the selected signal Sn to the outside through an output part 114.

Figure 24:
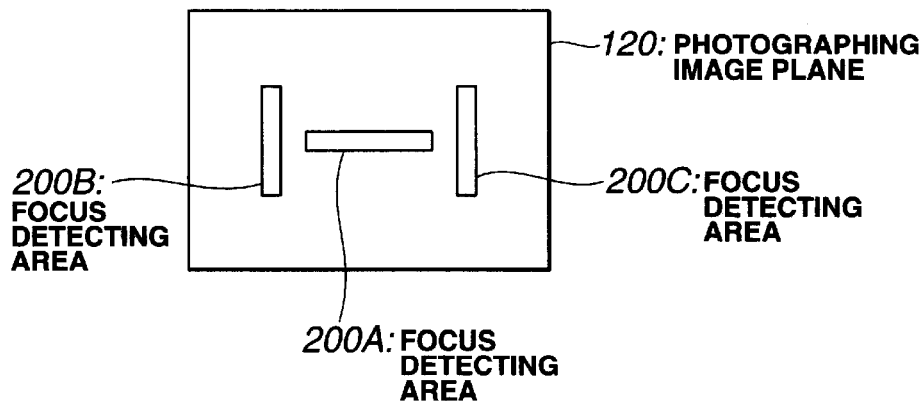
FIG. 24 is a view showing the detailed construction of the image pickup element according to the fourth embodiment.

FIG. 24 illustrates two portions into which the image pickup element 6 is functionally divided. As shown in FIG. 24, the image pickup element 6 is made of the image pickup part 100 which uses pixel signals for photographing purposes and the focus detecting part 200 which uses pixel signals for focus detecting purposes. The image pickup part 100 is formed over approximately the entire surface of the image pickup element 6, while the focus detecting part 200 is formed in part of the image pickup element 6. Moreover, in a photographing image plane 120, a focus detecting area 200A is disposed on the optical axis, and a focus detecting area 200B is disposed off the optical axis and in a direction perpendicular to the focus detecting area 200A.

Microlenses are respectively arranged in front of the photodiodes which are photoconductive elements. A so-called on-chip microlens is an established art for improving the optical sensitivity of an image pickup element. In this art, microlenses are respectively disposed at positions corresponding to photodiodes so that incident light is efficiently converged onto photoconductive parts. In the image pickup part 100, the microlenses are set to optimize the optical sensitivity as described above.

Figure 25:
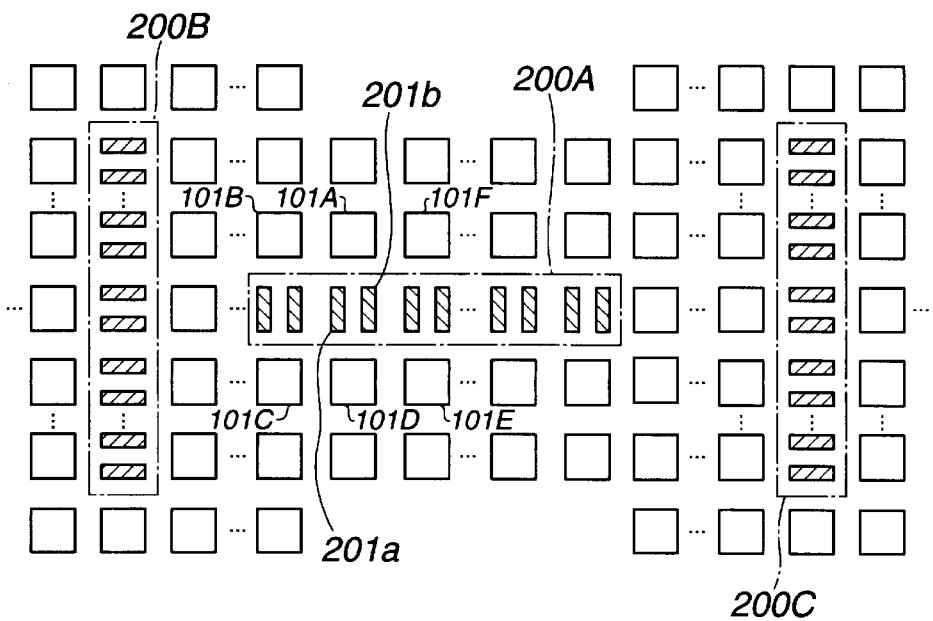
FIG. 25 is a view showing the detailed construction of the image pickup element according to the fourth embodiment.

FIG. 25 is a view showing the array of the photodiodes which constitute photoconductive elements on the image pickup element 16. Plural units each including a pair of photodiodes 201a and 201b are arrayed in each of the focus detecting areas 200A to 200C. The photodiodes 101 are arrayed in the image pickup part 100.

Figure 26:
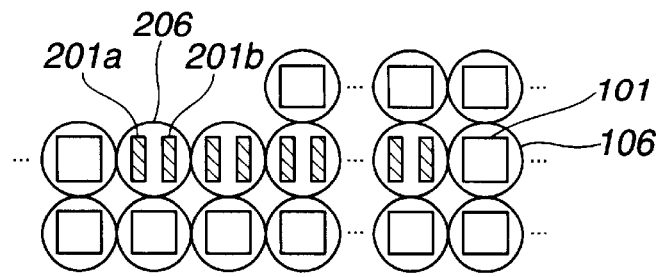
FIG. 26 is a view showing the detailed construction of the image pickup element according to the fourth embodiment.

FIG. 26 is a view showing the arrangement of the photodiodes and the microlenses.

In each of the focus detecting areas 200A to 200C, one microlens 206 is disposed for each pair of photodiodes 201a and 201b, and in the image pickup part 100, one microlens 106 is disposed for each of the photodiodes 101.

Figure 27:
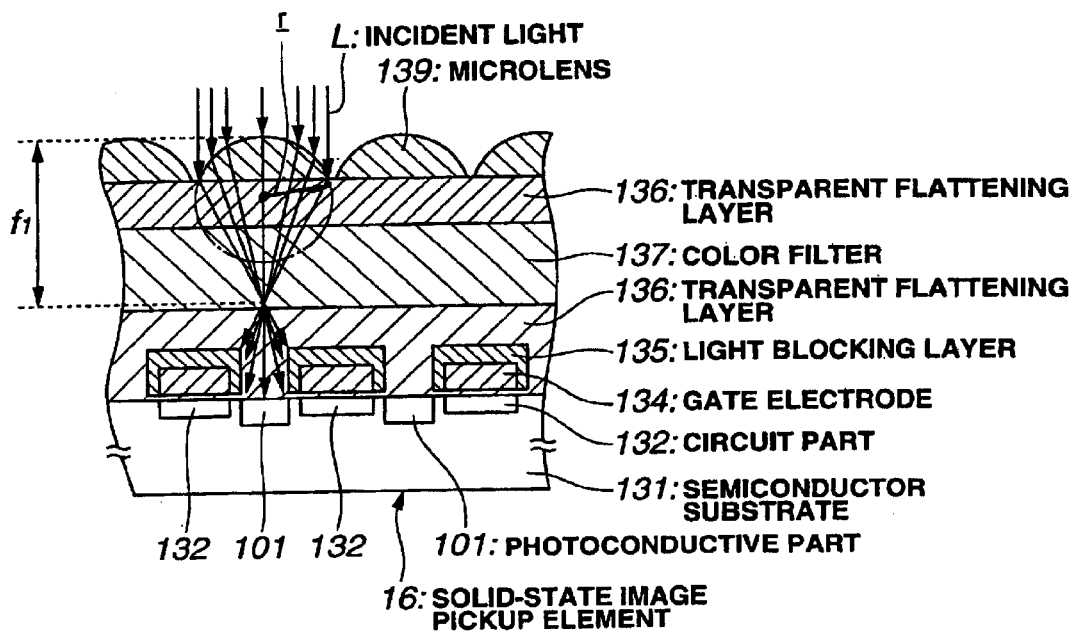
FIG. 27 is a view showing a general cross-sectional construction of an image pickup element on which on-chip microlenses are formed according to the fourth embodiment.

FIG. 27 is a view showing a general cross-sectional construction of an image pickup element on which on-chip microlenses are formed. The image pickup part 100 of the image pickup element 6 in the image pickup apparatus according to the fourth embodiment is approximately similar in construction to that shown in FIG. 27. In addition, FIG. 27 is approximately similar to FIG. 6 which shows the first embodiment.

As shown in FIG. 27, photodiodes which constitute the respective photoconductive parts 101 made from a diffusion layer or the like are formed in the semiconductor substrate 131 made of silicon.

The circuit parts 132 each of which constitutes a circuit which amplifies the output of the corresponding one of the photodiodes, the gate electrodes 134 and the like are covered with the light blocking film 135. In addition, the photoconductive parts 101 are formed to correspond to the respective openings of the light blocking film 135, and the color filter 137 is formed above the photoconductive parts 101 and the light blocking film 135. Moreover, microlenses 139 each made from a sphere having a predetermined radius of curvature r and a focal length f1 are formed above the color filter 137.

Figure 28:
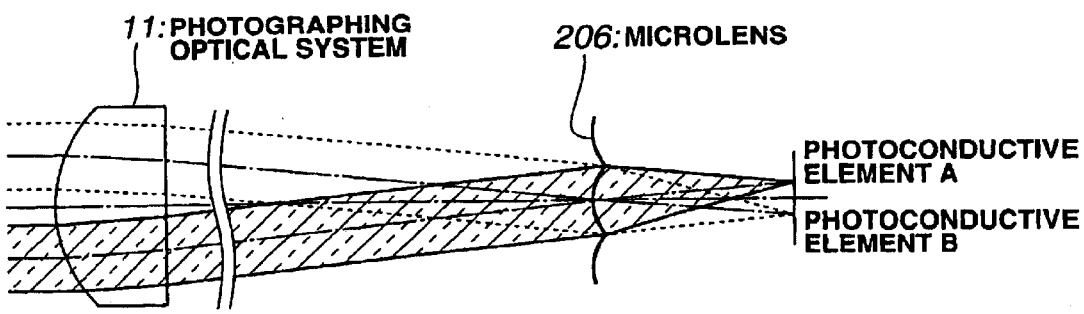
FIG. 28 is a view showing the manner in which a light beam transmitted through a photographing optical system according to the fourth embodiment is divided into two light beams by pupils and the two light beams are respectively made incident on a pair of photoconductive elements.

The microlenses 206 which correspond to the focus detecting part 200 differ from the microlenses 106 (139) of the image pickup parts 100 in optical characteristic such as radius of curvature and focal length, and photodiodes A and B which constitute a pair of photoconductive elements are disposed at approximately a focal plane of the microlens 206. As shown in FIG. 28, the microlens 206 operates to divide a light beam transmitted through the photographing optical system 11 into two light beams through its divided pupils, and make the respective light beams incident on a pair of photodiodes A and B. Incidentally, FIG. 28 is approximately similar to FIG. 7 which shows the first embodiment. The principle of focus detection of the fourth embodiment is similar to the phase-difference detecting method disclosed in the above-cited Japanese Patent Publication No. 49841/1982, and the detailed description thereof is omitted herein.

Figure 29:
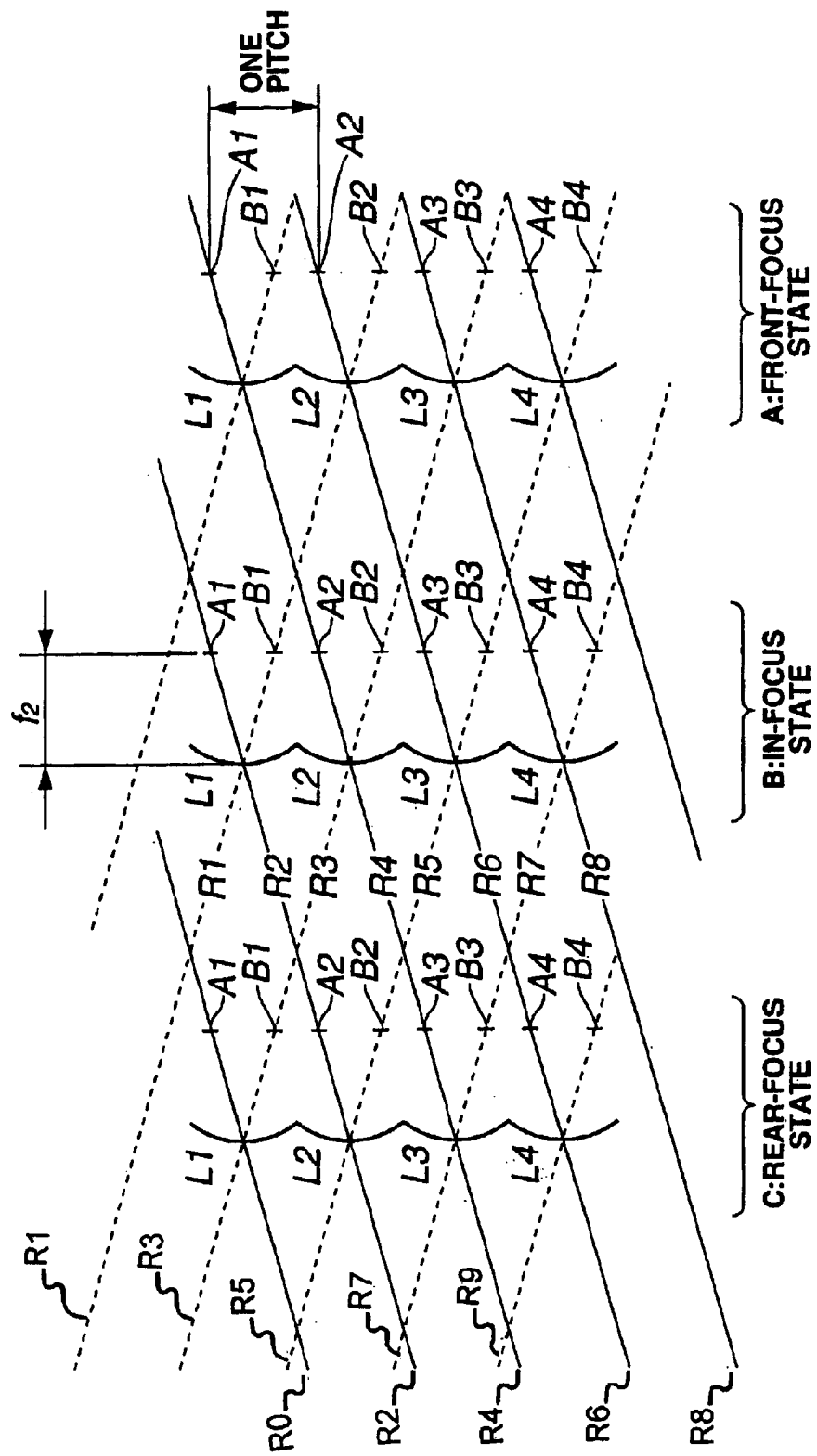
FIG. 29 is a view showing examples of an in-focus state, a front-focus state and a rear-focus state of a focus detecting part in an image pickup element according to the fourth embodiment.

FIG. 29 illustrates examples of an in-focus state, a front-focus state and a rear-focus state in the focus detecting part 200. Incidentally, FIG. 29 is approximately similar to FIG. 8 which shows the first embodiment.

Actually, the microlenses Ln and the photoconductive elements An and Bn are fixed and the position of the photographing optical system 1 moves. However, for the convenience of description, the relative positional relationship between the photographing optical system 1 and the microlenses Ln and the photoconductive elements An and Bn will be described below on the assumption that the photographing optical system 1 is fixed.

The microlens Ln has a focal length of f2 which is approximately equal to the distance between the microlens Ln and the photodiodes An and Bn.

During the in-focus state, rays R1 and R2, R3 and R4, which are light beams emitted from the same subject, pass through different exit pupils of the microlenses Ln, and the light quantities received by the respective photoconductive elements An and Bn which are adjacent to each other about the optical axis of each of the microlenses Ln coincide with each other. For example, in the in focus state, the rays R3 and R4 correspond to the microlens L2 and the photoconductive elements B2 and A2.

In the case of the front-focus state, the light quantities of light beams which respectively pass through different ones of the microlenses Ln and are received by the photoconductive elements A and B, i.e., the light quantities received by non-adjacent ones of the photoconductive elements An and Bn, coincide with each other. For example, the respective rays R3 and R4 emitted from the same subject correspond to the microlens L3 and the photoconductive element B3 and to the microlens L1 and the photoconductive element A1, respectively. Accordingly, an image deviates by two pitches.

In the case of the rear-focus state, although light quantities coincide between adjacent ones of the photoconductive elements, rays transmitted through different ones of the microlenses enter the adjacent photoconductive elements. For example, the respective rays R3 and R4 emitted from the same subject correspond to the microlens L1 and the photoconductive element B1 and to the microlens L3 and the photoconductive element A3, respectively. Accordingly, an image deviates by two pitches in the opposite direction to the direction of image deviation during the front-focus state.

In this manner, an image deviation occurs according to a focus deviation quantity. Actually, since the focus detection accuracy lowers in the case of an image deviation quantity (phase difference) which occurs in the above-described units of one pitch, processing such as a known interpolation computation is performed to perform focus detection of one pitch or less. In this manner, by detecting an image deviation quantity, it is possible to find the focus deviation quantity of a photographing lens.

Figure 30:
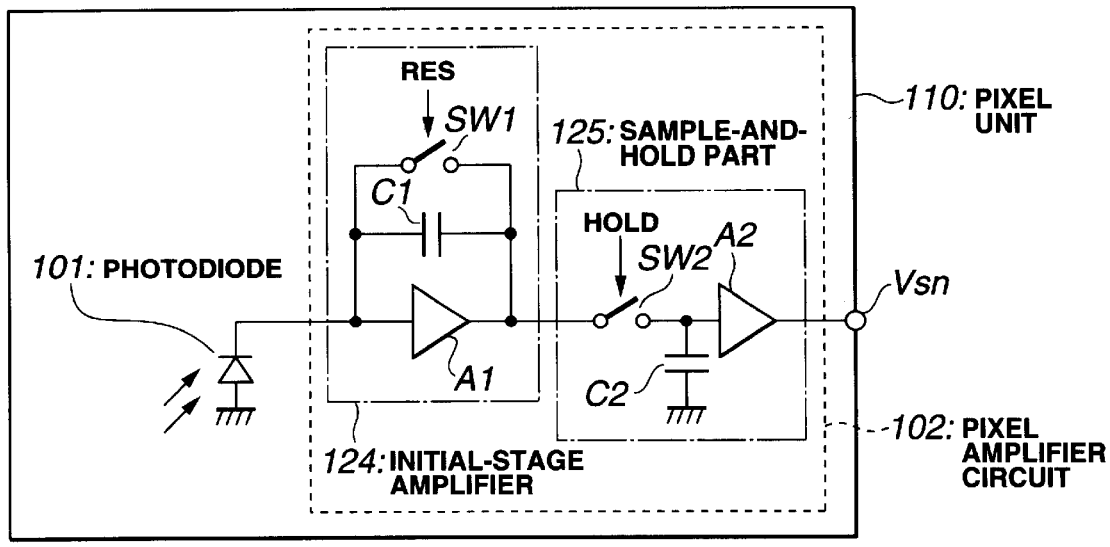
FIG. 30 is a view showing the construction of a pixel unit which is one of pixel units arranged two-dimensionally in the horizontal and vertical directions in the image pickup part according to the fourth embodiment, the pixel unit being positioned in a predetermined portion of the image pickup part.

FIG. 30 is a view illustrating the construction of the pixel unit 110 which is one of the pixel units 110 disposed two-dimensionally in the horizontal and vertical directions as shown in FIG. 23 and is located in a portion of the image pickup part 100.

Refering to FIG. 30, in the pixel units 110, the output of the photodiode 101 is connected to the input of a pixel amplifier circuit 102 which amplifies the charge generated by the photodiode 101. This pixel amplifier circuit 102 includes an initial-stage amplifier 124 and a sample-and-hold part 125.

The initial-stage amplifier 124 includes an amplifier A1, a storage capacitor C1 and a switch SW1, and constitutes an integrator. The output of the initial-stage amplifier 124 is connected to the input of the sample-and-hold part 125. The sample-and-hold part 125 includes a switch SW2, a hold capacitor C2 and a buffer A2.

When the switches SW1 and SW2 are turned on, the pixel unit 110 is initialized, and then when the switch SW1 is turned off, a storage operation is started. Moreover, when the switch SW2 is turned off, a storage level is held in the hold capacitor C2 and the storage operation is brought to an end. Incidentally, the timing of turning on and off each of the switches SW1 and SW2 is controlled by the control part 111.

The storage level held in the hold capacitor C2 is outputted to an output Vsn via the buffer A2. When the pixel unit 110 is selected by the X shift register 112, the signal Vsn the Y shift register 113 and is outputted to the output part 114.

The above-described focus detecting part 200 includes pixel units 210. The pixel units 210 are arrayed in the focus detecting part 200 and each of the pixel units 210 is made of a pair of photodiodes 201a and 201b which respetively receive light beams divided by different exit pupils of the photographing lens 11, and pixel amplifier circuits 202a and 202b which amplify charges generated by the respective photodiodes 201a and 201b.

Figure 31:
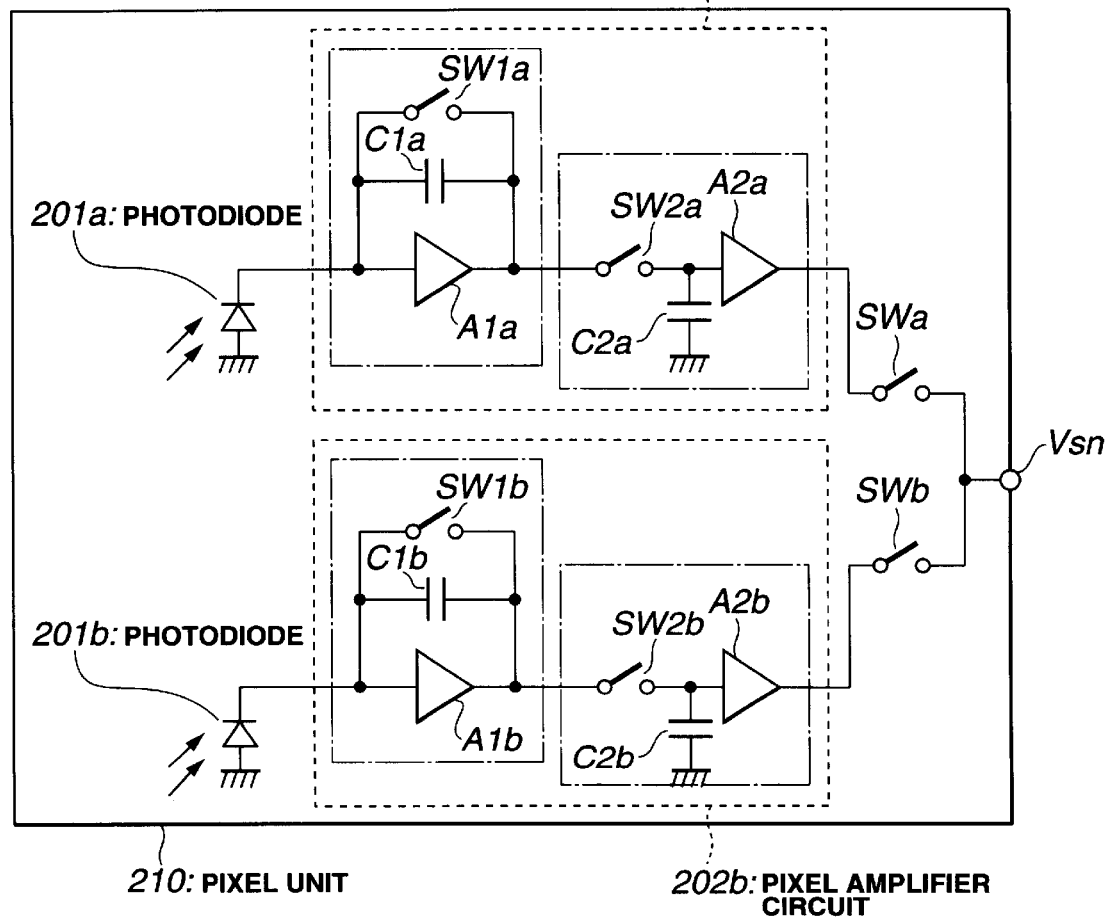
FIG. 31 is a view showing the detailed construction of the pixel unit shown in FIG. 30.

FIG. 31 is a view showing the detailed construction of one of the pixel units 210. As shown in FIG. 31, each of the pixel amplifier circuits 202a and 202b has a construction similar to the pixel amplifier circuit 102. The outputs of the pixel amplifier circuits 202a and 202b are selectively connected to the output Vsn via switches SWa and SWb controlled by the control part 111. Similarly to the output Vsn of the pixel unit 103, when the pixel unit 210 is selected by the X shift register 112 and the Y shift register 113 outside the pixel unit 210, the output Vsn is outputted to the output part 114.

Figure 32:
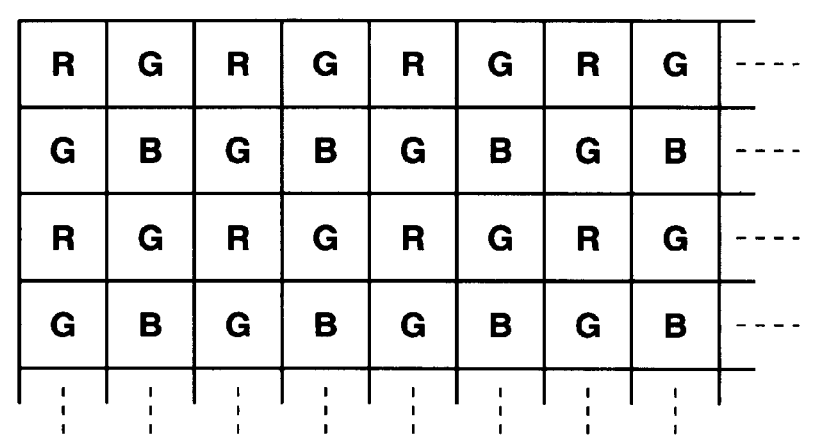

The color filter 137 is disposed in front of the photodiodes 101 of the image pickup part 100. The array of color elements of the color filter 137 is a so-called Bayer matrix as shown in FIG. 32 (as well as FIG. 9). In FIG. 32, symbols R, G and B denote color filters which selectively transmit red, green and blue, respectively.

No color filter is disposed in front of the photodiodes 201a and 201b of the focus detecting part 200, and the color filter 137 is disposed in front of only the image pickup part 100.

In this manner, by making focus detection as to each of the plural focus detecting areas 200A, 200B and 200C (refer to FIG. 24), it is possible to perform processing using a known algorithm such as the processing of automatically selecting a closest subject. A photographer can select an AF area through the area selecting switch 49 (which will be described later) and bring the selected area into focus. In the focus detecting area 200A, it is possible to detect the focus of a subject which has contrast in the lateral direction of the photographing image plane 120, for example, a vertical line.

On the other hand, in the focus detecting areas 200B and 200C, it is possible to detect the focus of a subject which has contrast in the vertical direction of the photographing image plane 120 shown in FIG. 24, for example, a lateral line. Accordingly, it is possible to detect the focus of a subject which has contrast in only one direction.

During image formation, since there is no image data as to the portions of the focus detecting area 200A, 200B and 200C shown in FIG. 24, it is necessary to supply image data. A method of supplying this image data will be described below. Referring to FIG. 25 mentioned previously, image data as to, for example, the portions of the photodiodes 201a and 201b of the focus detecting area 200A is obtained by performing interpolation using the pixel signals of photodiodes 101A to 101E which belong to the image pickup part 100 and are pixels neighboring the photodiodes 201a and 201b.

At this time, only pixel data of the same color filter may, of course, be used. The method of interpolation computation can adopt various methods such as a method of performing simple averaging or weighted averaging on the pixel signals of the photodiodes 101A to 101E. Such a method is previously publicly known, and the detailed description thereof is omitted herein.

Figure 33:
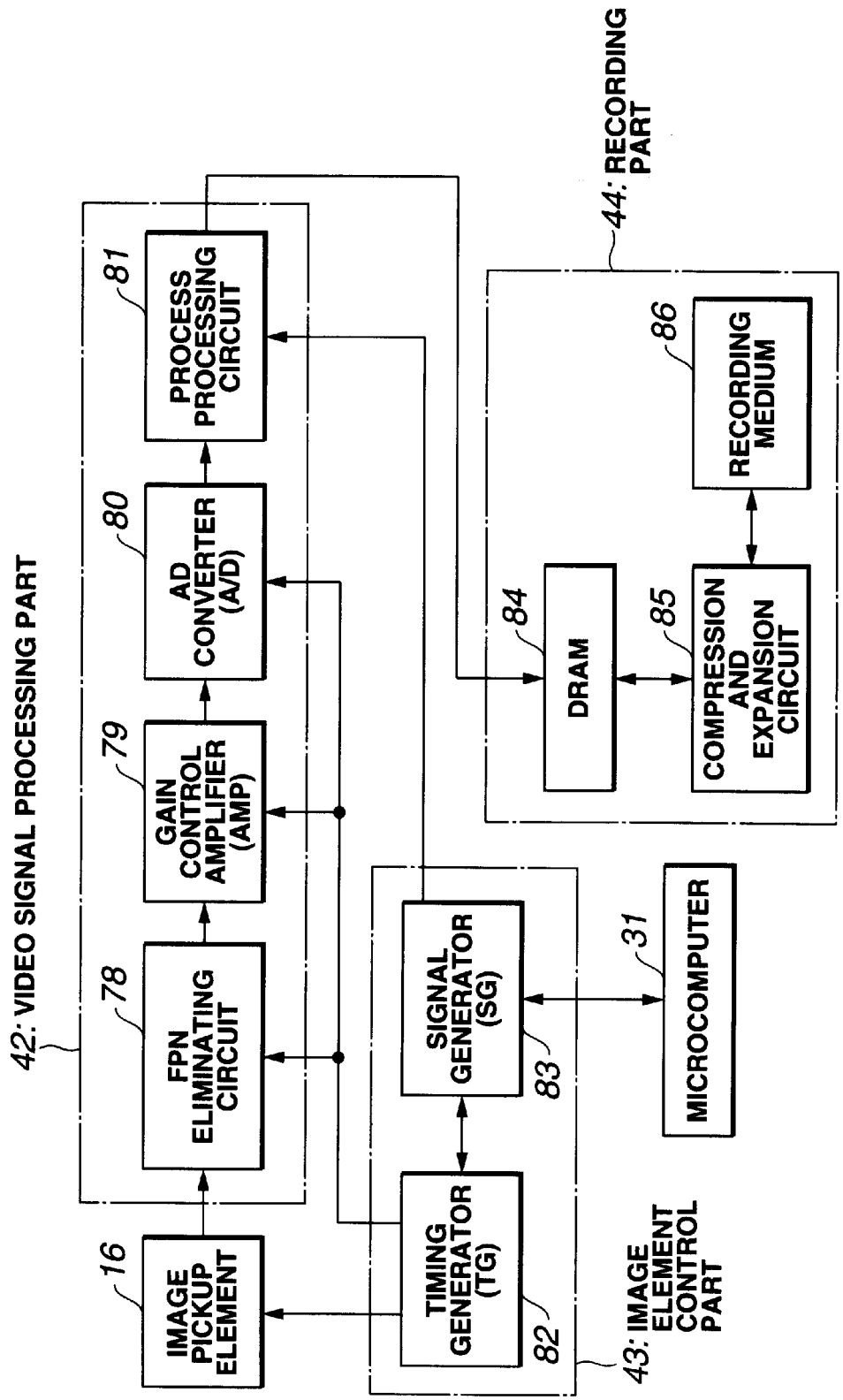
FIG. 33 is a view showing the detailed construction of a video signal processing part in the image pickup element according to the fourth embodiment.

FIG. 33 illustrates the detailed construction of the video signal processing part 42. Incidentally, FIG. 33 is approximately similar to FIG. 3 which shows the first embodiment.

Referring to FIG. 33, a fixed pattern noise (FPN) eliminating circuit 78 eliminates FPN or the like from an image signal of the image pickup element 16. A gain control amplifier (AMP) 79 amplifies the output of the FPN eliminating circuit 78 with a predetermined gain.

An A/D converter 80 performs A/D conversion on the output of the gain control amplifier 79 to convert it into a digital signal. A process processing circuit 81 performs various kinds of processing on the video signal converted into the digial signal.

The image pickup element control part 43 outputs a driving signal to the image pickup element 16 to control the operation thereof. The image pickup element control part 43 is made of the timing generator 82 and the signal generator 83.

The timing generator (TG) 82 generates a driving signal such as a driving pulse to drive the image pickup element 16, and also generetes a sample-and-hold pulse for the FPN eliminating circuit 78 and a AD conversion timing pulse for the A/D converter 80. The signal generator (SG) 83 generates a signal for establishing synchronism between the timing generator 82 and the microcomputer 31.

The recording part 44 is made of the DRAM 84, the compression and expansion circuit 85 and the recording medium 86. A video signal (pixel data) outputted from the process processing circuit 81 in the video signal processing part 42 is stored in the DRAM 84. The compression and expansion circuit 85 performs compression processing for reducing the amount of pixel data stored in the DRAM 84, for recording purposes, and expansion processing for restoring compressed data read from the recording medium 86. The recording medium 86 records the compressed still image data.

Figure 34:
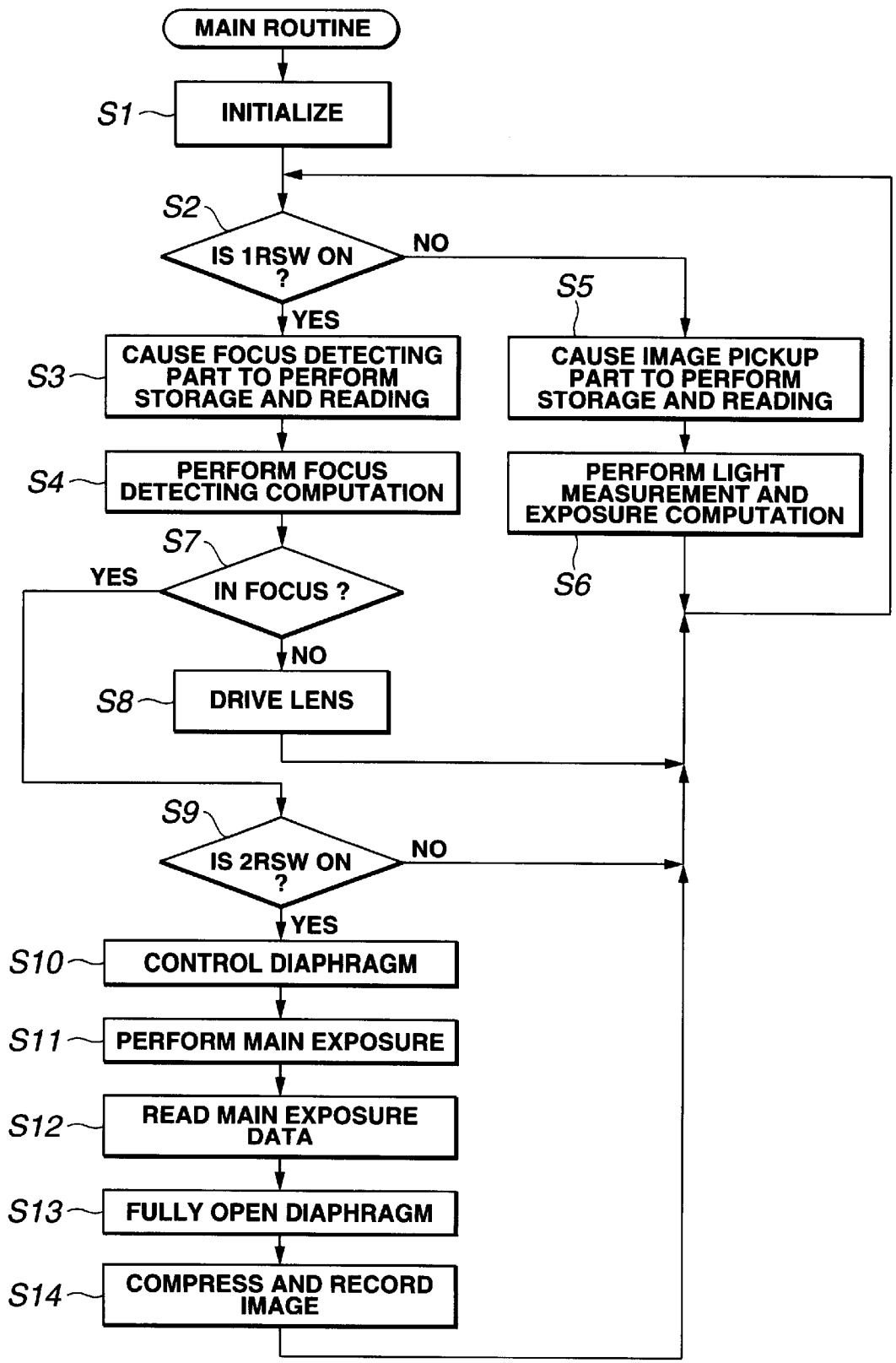
FIG. 34 is a flowchart showing in detail the operation of a microcomputer in an image pickup apparatus according to the fourth embodiment.

The operation of the microcomputer 31 will be described below in detail with reference to the flowchart shown in FIG. 34. In the following descritpion, reference will be made to the time charts shown in FIGS. 35A to 35G.

First of all, when a power switch SW (not shown) is turned on or a battery is inserted, the microcomputer 31 starts operating and executes the sequence program stored in the internal ROM 31b.

In the sequence of the main routine, first of all, each block of the image pickup apparatus is initialized (Step S1). Then, the state of the 1RSW 47 is detected (Step S2).

If the 1RSW 47 is off, an image pickup operation such as a storage (exposure) operation and a reading operation for the image pickup part of the image pickup element 6 is performed (Step S5), and the light measuring and exposure computing part 45 performs a light measurement and an exposure computation on the basis of a video signal of the image pickup part 100 received from the video signal processing part 42, and calculates an aperture control value of the diaphragm part 12 and an electronic shutter speed of the image pickup element 6 for main exposure photography (image recording) (Step S6). Then, the process returns to Step S2.

On the other hand, if the 1RSW 47 is on, a storage operation (exposure for AF) for the focus detecting part 200 of the image pickup element 6 is performed, an image signal of the focus detecting part 200 is read (Step S3) and a focus detecting computation based on the read image signal is performed (Step S4).

Figure 35:
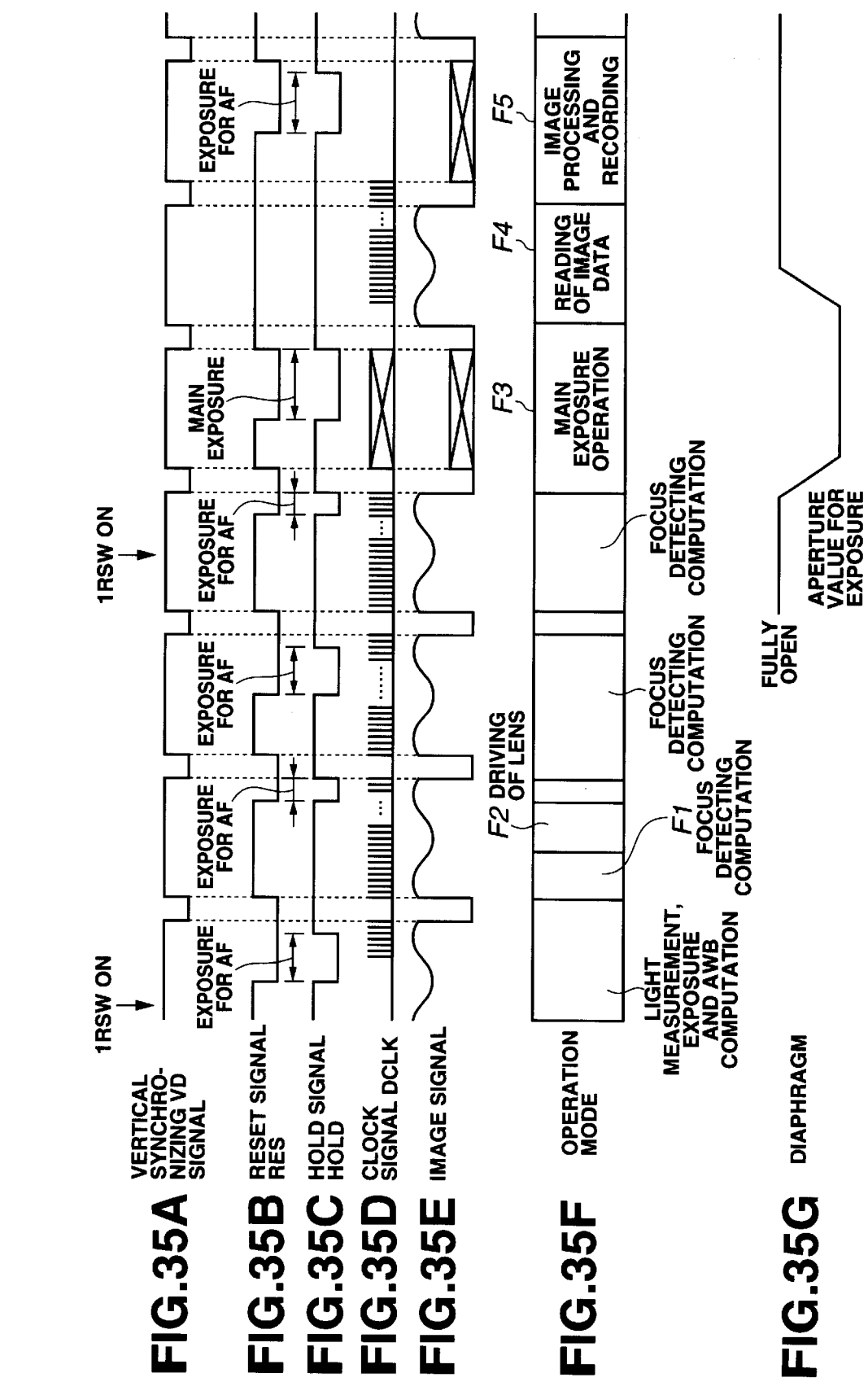
FIGS. 35A, 35B, 35C, 35D, 35E, 35F and 35G are timecharts illustrating in detail the operation of the microcomputer in the image pickup apparatus according to the fourth embodiment.

Incidentally, the focus detecting computation is executed at timing F1 of FIG. 35F, and can adopt a publicly known method such as a method of comparing the results of computations performed on the focus detecting areas 200A, 200B and 200C and selecting a closest-distance area.

Subsequently, it is determined whether the result of the focus detecting computation indicates an in-focus state or an out-of-focus state (Step S7), and if the result is an in-focus state, the process proceeds to Step S9. If the result is an out-of-focus state, the process proceeds to Step S8, in which the amount of movement of the focusing lens 1a which is required to achieve an in-focus state is calculated on the basis of the result of the focus detecting computation, and the focusing lens 1a is driven. After that, the process returns to Step S2, and the above-described AF operation is repeated. The driving of the focusing lens 1a is executed at timing F2 of FIG. 35F.

In Step S9, it is detected whether the 2RSW 48 is on. If the 2RSW 48 is on, the process proceeds to Step S10. If the 2RSW 48 is off, the process returns to Step S2 and continues to perform the AF operation while waiting for the 2RSW 48 to be turned on.

In Step S10 and the following steps, a main exposure operation is executed.

First of all, the microcomputer 31 controls the diaphragm driving part 33 to reduce the diaphragm part 12 to an exposure aperture value (Step S10). The image pickup element control part 43 switches off a charge reset signal RES (refer to FIG. 35B) and causes the image pickup element 6 to start a storage operation, and executes the main exposure by controlling the image pickup element 6 at an electronic shutter speed based on the exposure computation (Step S11).

This main exposure operation is executed at timing F3 of FIG. 35F.

This electronic shutter operation is performed by the image pickup element control part 43 generating a charge storage signal HOLD at predetermined timing according to a shutter speed and holding the stored charge of the photodiode 101 (refer to FIG. 35C).

Then, the image pickup element control part 43 outputs an image reading signal DCLK to the image pickup element 16, and the video signal processing part 42 performs A/D conversion on the image signal (image pickup element signal) of the image pickup part 100 outputted in synchronism with the image reading signal DCLK (refer to FIG. 35D) and reads the obtained digital image signal (Step S12). The reading of the image data is executed at timing F4 of FIG. 35F.

Moreover, the microcomputer 31 controls the diaphragm driving part 33 and transmits a fully open aperture command to fully open the diaphragm part 12 (Step S13), and performs processing such as compression of the read image signal and then stores the compressed image signal in the recording medium 86 (Step S14). These image processing and recording operations are performed at timing F5 of FIG. 35F.

When the above-described series of operations is completed, the process returns to Step S2 and the above-described operation is repeated.

A fifth embodiment of the present invention will be described below.

The fifth embodiment of the present invention differs from the fourth embodiment in the arrangement of a focus detecting area.

Figure 36:
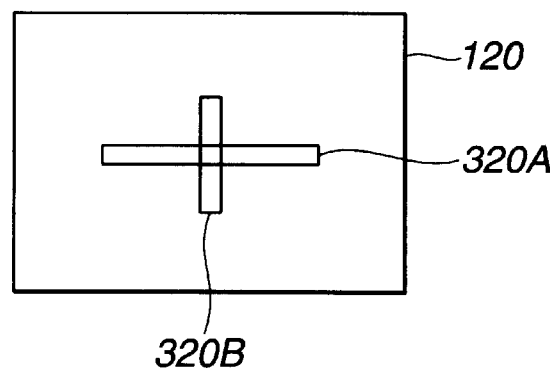
FIG. 36 is a view showing the manner of arrangement of focus detecting areas of an image pickup element in an image pickup apparatus according to a fifth embodiment.

FIG. 36 is a view showing the arrangement of focus detecting areas of an image pickup elements in an image pickup apparatus according to the fifth embodiment. As shown in FIG. 36, a focus detecting area 320A is disposed to be centered at the optical axis of the photographing lens and to extend in parallel with the longer sides of the photographing image plane 120, while a focus detecting area 320B is disposed to be centered at the optical axis of the photographing lens and to extend in a direction perpendicular to the focus detecting area 320A.

Figure 37:
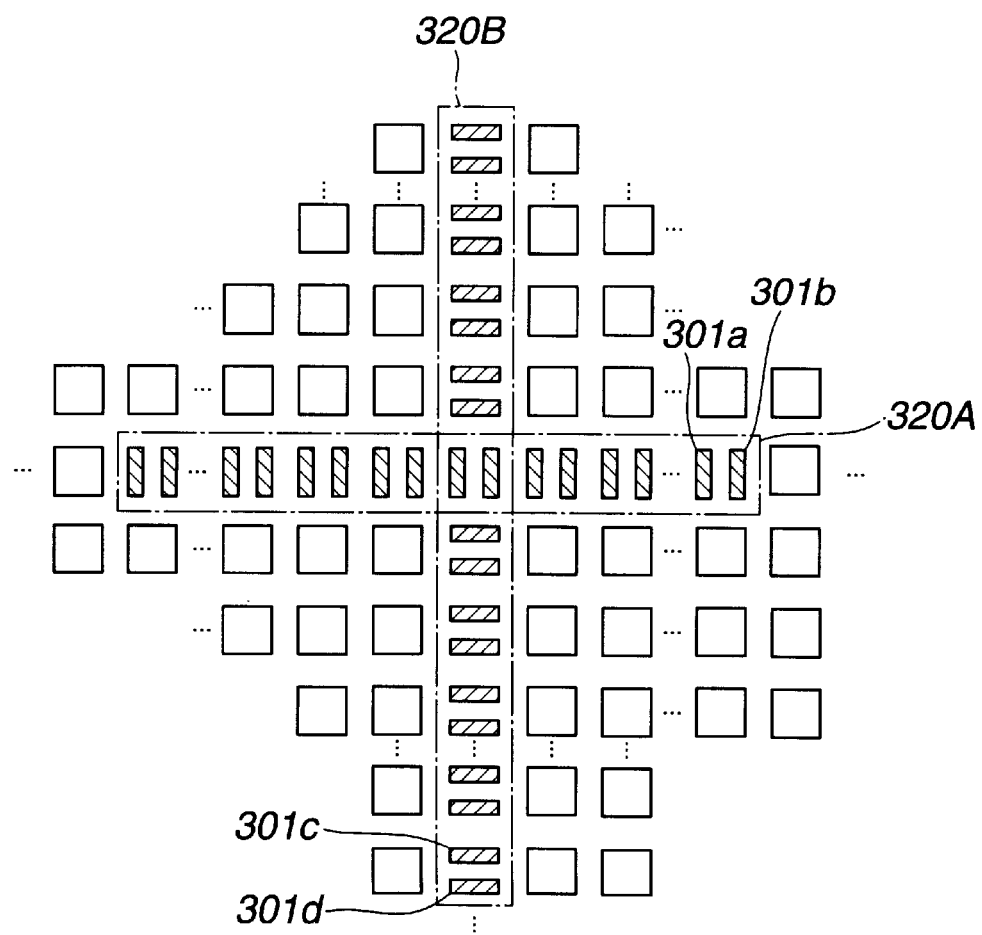
FIG. 37 is a view showing the arrangement of photodiodes in the image pickup element of the image pickup apparatus according to the fifth embodiment.

FIG. 37 shows the arrangement of photodiodes in the image pickup element of the image pickup apparatus according to the fifth embodiment. As in the case of the fourth embodiment, the image pickup parts 100 are formed over the entire surface of the image pickup element 6, and as shown in FIG. 37, the focus detecting parts 320A and 320B are formed in a portion corresponding to the focus detecting area.

Plural pairs of photodiodes 301a and 301b of the focus detecting area 320A are arrayed in parallel with the longer sides of the photographing image plane 120, to form part of the focus detecting area. Plural pairs of photodiodes 301c and 301d of the focus detecting area 320B are arrayed perpendicularly to the longer sides of the photographing image plane 120, i.e., in parallel with the shorter sides of the photographing image plane 120, to form part of the focus detecting area.

In the fifth embodiment, since a cross-shaped focus detecting area is disposed in this manner, the focus of a subject which lies in an area near the center of the photographing image plane can be detected irrespective of the direction of the contrast of the subject.

A sixth embodiment of the present invention will be described below.

Figure 38:
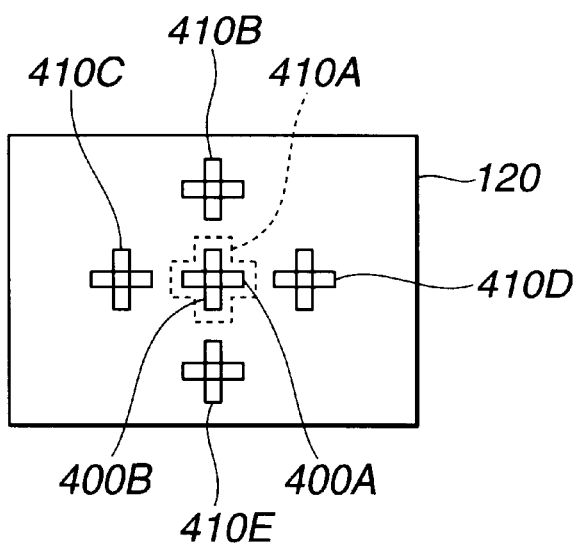
FIG. 38 is a view showing the arrangement of an image pickup element in an image pickup apparatus according to a sixth embodiment.

FIG. 38 is a view showing the arrangement of an image pickup element of an image pickup apparatus according to the sixth embodiment.

The sixth embodiment has plural cross-shaped focus detecting areas each of which is similar to the cross-shaped focus detecting area shown in the fifth embodiment.

A cross-shaped focus detecting area 410A is made of a horizontal focus detecting area 400A and a vertical focus detecting area 400B. The arrangement of photodiodes of the image pickup element 6 which neighbor each of the cross-shaped focus detecting area 410A and similar cross-shaped focus detecting areas 410B to 410E is similar to that shown in FIG. 37, and the repetition of the same description is omitted herein.

In the sixth embodiment, since the number of cross-shaped focus detecting areas is increased, focus detection is enabled over the entire photographing image plane without being affected by the direction of the contrast of a subject.

A seventh embodiment of the present invention will be described below.

Figure 39:
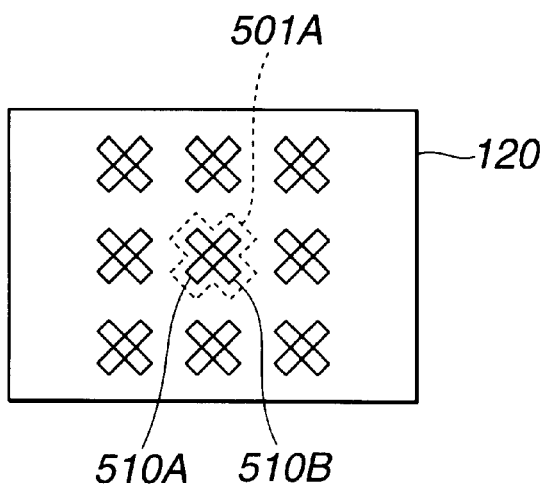
FIG. 39 is a view showing the arrangement of an image pickup element in an image pickup apparatus according to a seventh embodiment.

FIG. 39 is a view showing the arrangement of an image pickup element of an image pickup apparatus according to the seventh embodiment.

Figure 40:
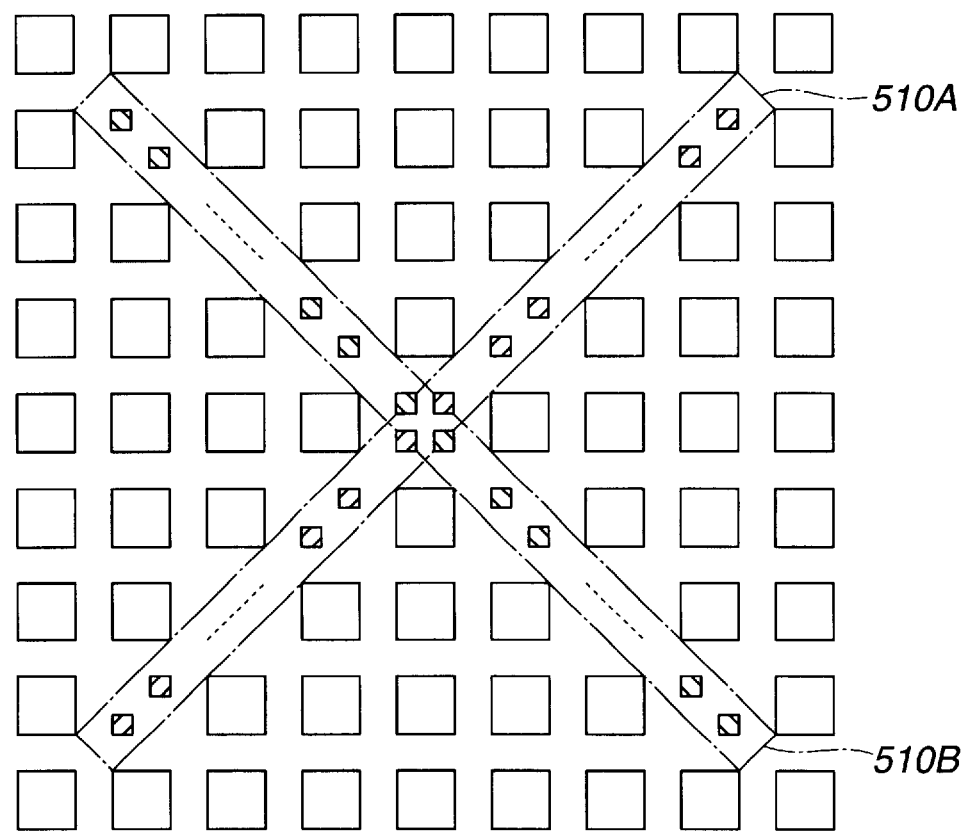
FIG. 40 is a view showing a cross-shaped focus detecting area and the surrounding pixel arrangement in the image pickup apparatus according to the seventh embodiment.

The seventh embodiment has a construction in which focus detecting areas are disposed to be extended obliquely with respect to the sides of the photographing image plane 120. The focus detecting areas are plural cross-shaped focus detecting areas 501A each formed by two focus detecting areas 510A and 510B disposed to cross each other. Incidentally, each of the cross-shaped focus detecting areas 501A and the surrounding pixel arrangement are as shown in FIG. 40.

An eighth embodiment of the present invention will be described below.

The eighth embodiment is a modification of the seventh embodiment, and differs from the first embodiment in the construction of a pixel unit.

Figure 41:
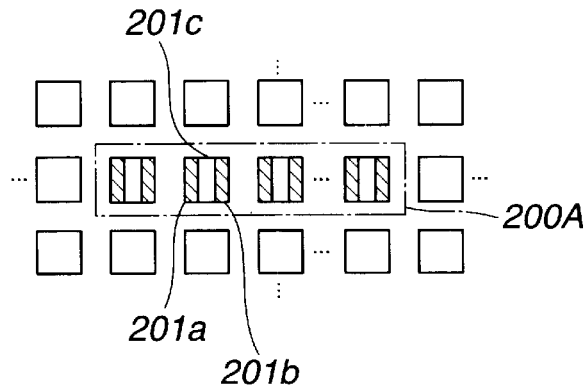
FIG. 41 is a view showing the construction of a focus detecting area in an image pickup element of an image pickup apparatus according to an eighth embodiment.
Figure 42:
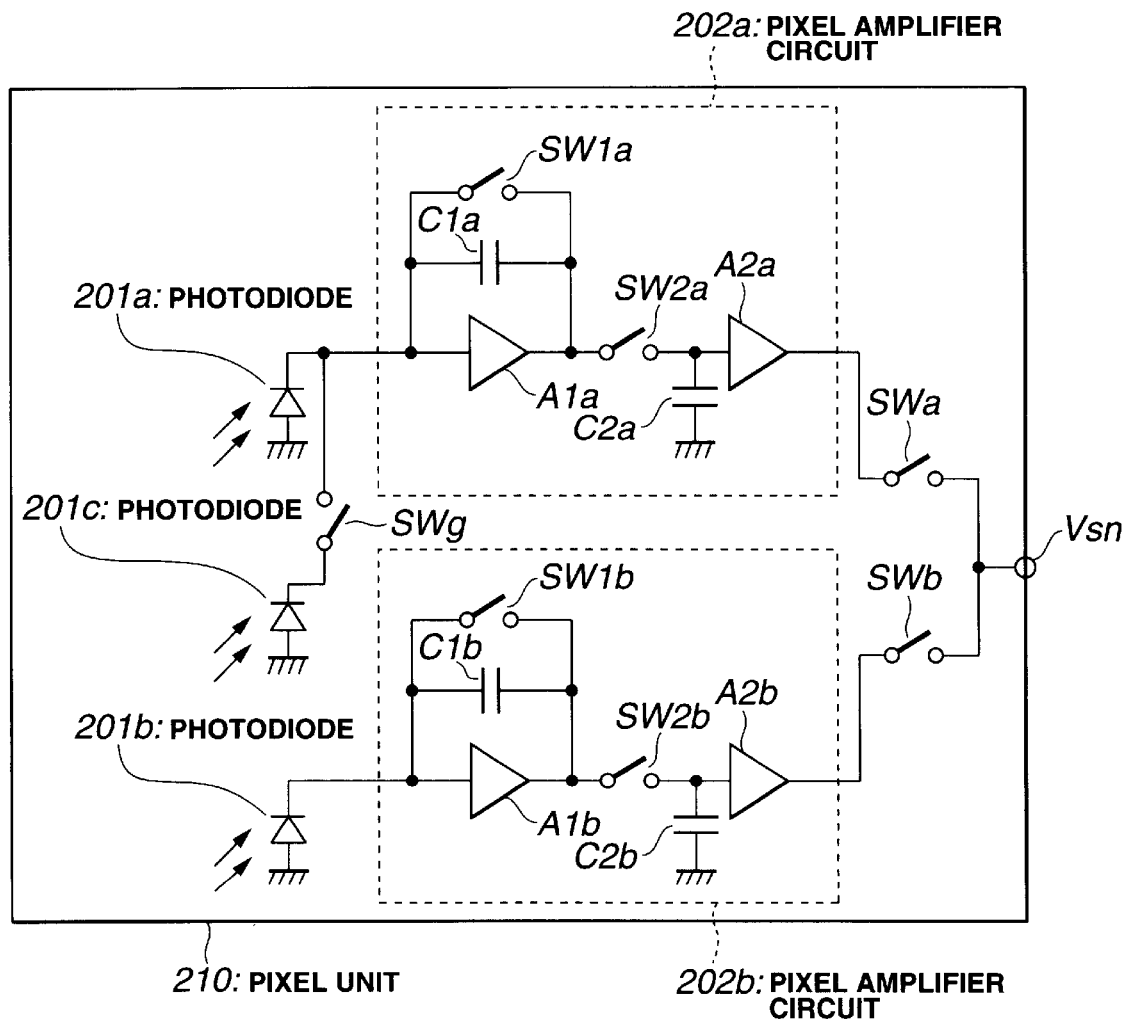
FIG. 42 is a view showing the construction of a pixel unit of the focus detecting area shown in FIG. 41.

FIG. 41 is a view showing the construction of the focus detecting area 200A in an image pickup element of an image pickup apparatus according to the eighth embodiment. FIG. 42 is a view showing the construction of the pixel unit 210 of the focus detecting area 200A.

As shown in FIG. 41, in the eighth embodiment, the focus detecting area 200A has plural pairs of photodiodes 201a and 201b as well as image pickup photodiodes 201c.

Referring to FIG. 42, during focus detecting operation, the pixel unit 210 performs a storage operation with a switch SWg in an off state. In this case, the eighth embodiment performs completely the same operation as the seventh embodiment.

During the operation of picking up an image to be recorded, although the focus detecting area 200A of the seventh embodiment does not perform a storage operation, the focus detecting area 200A of the eighth embodiment performs a storage operation at the same time as the image pickup part 100.

At this time, the switch SWg is turned on and the output of the photodiode 201c is also inputted to the pixel amplifier circuit 202a, whereby not only a pupil-divided light beam but also other wider light beams are received and converted into a voltage signal.

Then, the obtained added pixel signal of the photodiodes 201a and 201c and the pixel signal of the photodiode 201b are added together, whereby an image signal corresponding to the entire received light beam can be obtained.

In this manner, an image signal is formed as to each of the focus detecting areas 200A to 200C, whereby an image of far higher quality can be obtained.

Figure 43:
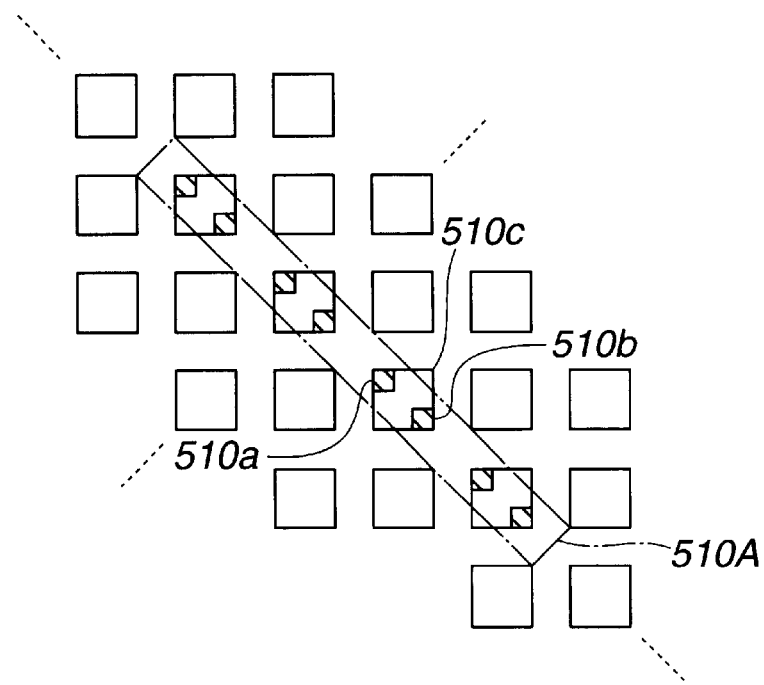
FIG. 43 is a view of a modification of the seventh embodiment, showing the arrangement of photodiodes of the focus detecting part in a case where the eighth embodiment is applied to the seventh embodiment (FIG. 40)

FIG. 43 is a view showing the arrangement of photodiodes of the focus detecting area 510A to which the eighth embodiment is applied instead of the seventh embodiment (FIG. 40). As shown in FIG. 43, the focus detecting area 510A has the photodiodes 501a and 501b as well as an image pickup photodiode 501c. During image pickup operation, an image signal is formed by adding together the quantities of light received by the photodiodes 501a, 501b and 501c.

As described above, the microlens 106 of the image pickup part 100 and the microlens 206 of the focus detecting part 200 differ from each other in optical characteristic and receive different light quantities. The difference between the light quantities is stored in the EEPROM 31e in advance, and the difference in light quantity between the microlens 106 and the microlens 206 is corrected for each pixel unit of the focus detecting part 200 to be matched to the image pickup part 100.

A ninth embodiment of the present invention will be described below.

The ninth embodiment is a modification of the seventh embodiment and differs from the seventh embodiment in the arrangement of photodiodes.

Figure 45:
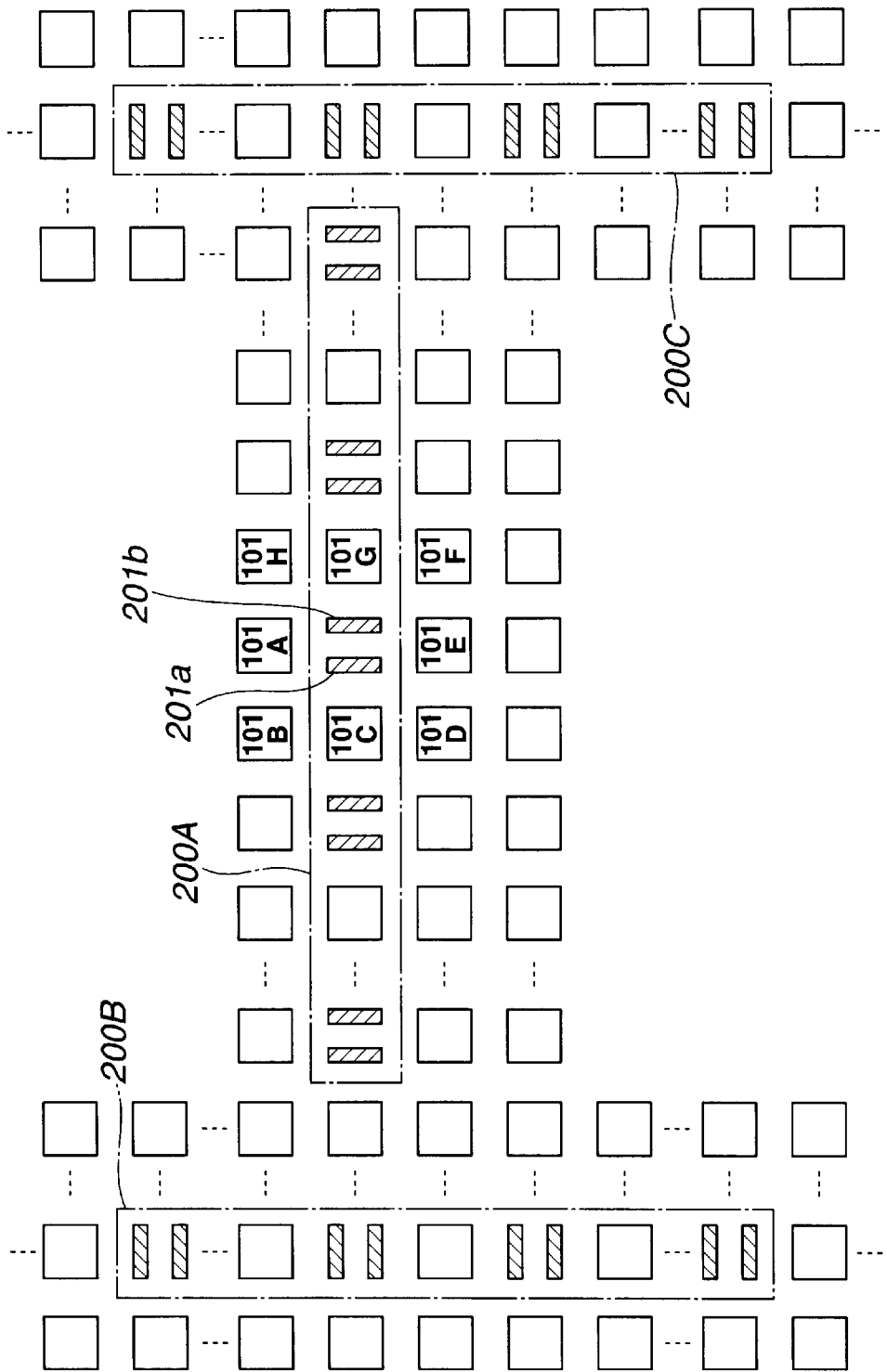
FIG. 45 is a view showing the arrangement of a focus detecting part of an image pickup element in an image pickup apparatus according to a ninth embodiment.

FIG. 45 is a view showing the arrangement of focus detecting areas of an image pickup element in an image pickup apparatus according to the ninth embodiment. As shown in FIG. 45, in each of the focus detecting areas 200A to 200C, a unit made of one pair of focus-detecting photodiodes 201a and 201b and an image pickup photodiode 101 are alternately disposed. In this construction, the detection pitch of the focus-detecting photodiodes 201a and 201b is about twice as large as that of the seventh embodiment. For this reason, the focus detection accuracy of the ninth embodiment is about ½ that of the seventh embodiment, but it is possible to improve the quality of an image to be obtained in the neighborhood of each of the focus detecting areas 200A to 200C.

An image signal as to the portion of the photodiodes 201a and 201b of the focus detecting area 200A is obtained by performing interpolation using the pixel signals of photodiodes 101A to 101H that indicate effective pixel data of the neighboring pixels.

In the ninth embodiment, since the number of effective pixel data for interpolation computation is increased compared to the seventh embodiment, it is possible to improve the quality of an image to a further extent.

Incidentally, although the units each made of one pair of focus-detecting photodiodes 201a and 201b and the image pickup photodiodes 101 are alternately disposed, it is, of course, possible to modify the ninth embodiment so that such units are disposed at intervals of two to five photodiodes 101.

A tenth embodiment of the present invention will be described below.

The tenth embodiment is a modification of the seventh embodiment, and differs from the seventh embodiment in the arrangement of color filters over photodiodes.

Figure 44:
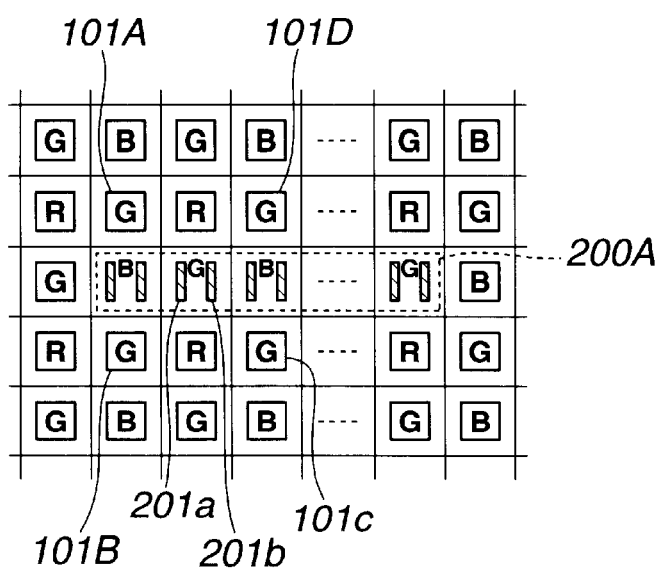
FIG. 44 is a view showing the arrangement of a focus detecting part of an image pickup element in an image pickup apparatus according to a tenth embodiment.

FIG. 44 is a view showing the arrangement of a focus detecting part of an image pickup element in an image pickup apparatus according to the tenth embodiment.

Although in the seventh embodiment no color filters are disposed over the focus detecting areas 200A to 200C, in the tenth embodiment, color filters are regularly arrayed over the focus detecting areas 200A to 200C (only 200A shown) as well as the image pickup part 100 in accordance with a Bayer matrix. During actual focus detection, pixel data obtainable from filters of the same color in the focus detecting areas 200A to 200C are selected to perform a focus detecting computation.

Incidentally, it is a matter of course that focus detecting computations on pixel signals of color G and pixel signals of color B may be individually performed to average the results of both computations or select either one of higher reliablity. In this case, although the detection pitch is coarse, pixel signal information obtained from the focus detecting areas 200A to 200C can be used during formation of an image to be recorded, whereby the quality of an image can be improved.

In addition, during formation of an image to be recorded, for example, as to the portion of the focus detecting area 200A, the pixel signals 201a and 201b (color G) are added together, and the obtained pixel signal is used as pixel data for that portion. In addition, interpolation processing may also be performed on the basis of neighboring pixel signals 101A to 101D of color G. Pixels of color B may also be processed in a similar manner.

Although, in the above description of each of the embodiments, reference has been made to a CCD as one example of an image pickup element, the construction of the present invention can readily be applied to other types of solid-state image pickup elements such as MOS sensors.

As described hereinabove, in the present invention, a divided-pupil small lens group and a group of photoconductive element pairs which receive pupil-divided light beams are formed in plural areas on the same chip as an image pickup element, and focus detection is performed on the basis of the output of the photoconductive element group. Accordingly, it is possible to provide an image pickup apparatus which is reduced in cost and space and has a focus detecting area of wide field of view and a focus adjusting function of high speed and high accuracy.

It is obvious that a wide variety of different embodiments can be made on the basis of the present invention without departing from the scope and spirit of the invention. The present invention is not to be construed to be limited to any other specific embodiment, and is defined solely in the appended claims.

What is claimed is:

1. An image pickup apparatus which photoelectrically converts an optical image transmitted through a photographing optical system and formed on a photoconductive surface, comprising:

a first microlens array and a second microlens array each of which has a focal position in the vicinity of the photoconductive surface and is arrayed in a two-dimensional manner;

a first photoconductive element group including units each formed by a single photoconductive element which is disposed in the vicinity of the focal position of the first microlens array and outputs a first video signal; and a second photoconductive element group including units each formed by a pair of photoconductive elements which are disposed in the vicinity of the focal position of the second microlens array and output a pair of second video signals.

2. An image pickup apparatus according to claim 1, wherein color filters arrayed on the basis of a predetermined rule are inserted in at least an optical path of the first microlens array.

3. An image pickup apparatus which photoelectrically converts an optical image transmitted through a photographing optical system and formed on a photoconductive surface, comprising:

a first microlens array and a second microlens array each of which has a focal position in the vicinity of the photoconductive surface and is arrayed in a two-dimensional manner;

a first photoconductive element group including units each formed by a single photoconductive element which is disposed in the vicinity of the focal position of the first microlens array and outputs a first video signal; and a second photoconductive element group including units each formed by a pair of photoconductive elements which are disposed in the vicinity of the focal position of the second microlens array and output a pair of second video signals, wherein the first microlens array and the second microlens array differ from each other in focal length and radius of curvature.

4. An image pickup element for use in an image pickup apparatus, comprising:

a first photoconductive element group which receives a subject light image;

a first small lens group which converges a subject light beam on the first photoconductive element group;

a second small lens group which divides by pupils a light beam transmitted through a photographing lens; and a second photoconductive element group including pairs of photoconductive elements which respectively receive light beans divided by pupils of a corresponding small lens of the second small lens group;

the second small lens group and the second photoconductive element group including the pairs of photoconductive elements being formed on one chip of the image pickup element.

5. An image pickup element according to claim 4, wherein a color filter is disposed in front of the first small lens group, whereas no color filter is disposed in front of the second small lens group.

6. An image pickup element according to claim 4, wherein a signal charge outputted from the first photoconductive element group is transferred through a first charge transfer path, which a signal charge outputted from the second photoconductive element group is transferred through a second charge transfer path.

7. An image pickup element, for use in an image pickup apparatus, comprising:

a first photoconductive element group which receives a subject light image;

a first small lens group which converges a subject light beam on the first photoconductive element group;

a second small lens group which divides by pupils a light beam transmitted through a photographing lens; and a second photoconductive element group including pairs of photoconductive elements which respectively receive light beans divided by pupils of a corresponding small lens of the second small lens group;

the second small lens group and the second photoconductive element group including the pairs of photoconductive elements being formed on one chip of the image pickup element, wherein the first small lens group and the second small lens group are constructed to differ from each other in optical characteristic.

8. An image pickup apparatus having an image pickup element which photoelectrically converts an optical image transmitted through a photographing optical system and formed on a photoconductive surface, comprising:

a first microlens array and a second microlens array each of which has a focal position in the vicinity of the photoconductive surface and is arrayed in a two-dimensional manner;

a first photoconductive element group including units each formed by a single photoconductive element which is disposed in the vicinity of the focal position of the first microlens array and outputs a first video signal; and a second photoconductive element group including units each formed by a pair of photoconductive elements which are disposed in the vicinity of the focal position of the second microlens array and output a pair of second video signals.

9. An image pickup apparatus according to claim 8, wherein a pair of second video signals outputted from each pair of second photoconductive elements of the second photoconductive element group are added together and a resultant signal is used as a picked-up image signal.

* * * * *